United States Patent [19]
Sakai et al.

[11] Patent Number: 5,872,393
[45] Date of Patent: Feb. 16, 1999

[54] RF SEMICONDUCTOR DEVICE AND A METHOD FOR MANUFACTURING THE SAME

[75] Inventors: Hiroyuki Sakai; Takayuki Yoshida, both of Osaka; Yorito Ohta, Hyogo; Kaoru Inoue, Shiga; Katsunori Nishii; Yoshito Ikeda, both of Osaka, all of Japan

[73] Assignees: Matsushita Electric Industrial Co., Ltd.; Matsushita Electronics Corporation, both of Osaka, Japan

[21] Appl. No.: 738,744

[22] Filed: Oct. 28, 1996

[30] Foreign Application Priority Data

Oct. 30, 1995 [JP] Japan .................................... 7-281801
Jan. 29, 1996 [JP] Japan .................................... 8-013199
Feb. 9, 1996 [JP] Japan .................................... 8-023584

[51] Int. Cl.⁶ ................................................... H01L 29/40
[52] U.S. Cl. ........................... 257/664; 257/701; 257/702
[58] Field of Search .................................. 257/714, 700, 257/701, 702, 664, 778

[56] References Cited

U.S. PATENT DOCUMENTS 5,717,251  2/1998  Hayashi et al. ......................... 257/758

FOREIGN PATENT DOCUMENTS 7-74285  3/1995  Japan .

OTHER PUBLICATIONS

H. Sakai et al., "A Novel Millimeter–Wave IC and Si Substrate Using Flip–Chip Bonding Technology", 1994 IEEE MTT–S Digest, pp. 1763–1766.

H. Sakai et al., "A Novel Millimeter–Wave IC on Si Substrate Using Flip–Chip Bonding Technology", IEICE Transactions on Electronics, vol. E78–C, No. 8, pp. 971–978 (Aug. 1995).

*Primary Examiner*—Peter Toby Brown
*Assistant Examiner*—Roy Potter
*Attorney, Agent, or Firm*—McDermott, Will & Emery

[57] ABSTRACT

In fabricating an MFIC by mounting a semiconductor chip on a substrate having a microstrip line by MBB bonding, a benzocyclobutene (BCB) film is used as a dielectric film of the microstrip line. By providing a means for preventing the deformation, peeling, and cracking of the BCB film during the fabrication process, the thickness of the dielectric film is held substantially equal even after flip-chip mounting, which reduces impedance fluctuations.

41 Claims, 32 Drawing Sheets

RF SEMICONDUCTOR DEVICE AND A METHOD FOR MANUFACTURING THE SAME

BACKGROUND OF THE INVENTION

The present invention relates to a semiconductor device using flip-chip mounting and to a method of manufacturing the same. In particular, it relates to a semiconductor device having an rf transistor for use at frequencies ranging from the K-band to the millimeter-wave band and to a method of manufacturing the same.

As the remarkable technological progress has been achieved in the field of telecommunications in recent years, the frequency band used in communication devices has upwardly shifted from the microwave band to the millimeter-wave band. This entails a remarkable increase in the operating speed of a transistor used in the communication devices so that a device having a hetero-junction compound semiconductor transistor with a cut-off frequency over 100 GHz has been implemented lately. In such a communication device using radio frequencies ranging from the quasi-microwave band to the millimeter-wave band, however, a method of mounting a semiconductor chip composing a circuit as well as transistor characteristics presents problems. For example, a parasitic capacitance or a parasitic inductance is easily produced in most cases after the mounting step was completed. Since the effects exerted by the parasitic capacitance and the like on the communication devices become larger in proportion to the level of the frequency used in the communication devices, these parasitic reactance components should be reduced more as a higher frequency is used. In the communication devices using frequencies ranging from the microwave band to the millimeter-wave band, the size of a connecting element interposed between circuit components approaches the wavelength of a signal, so that careful consideration should be given to the size of the connecting element at the designing stage. Naturally, extreme precision and accuracy is required of circuit components including passive elements and lines.

To overcome the above problems and implement a low-cost, high-performance semiconductor integrated circuit operating at K-band and millimeter-wave frequencies and having a wide range of applications, a conventional technique termed MFIC (millimeter-wave flip-chip IC) has been proposed (The Institute of Electronics, Information and Communication Engineers, Autumn Conference '94 Term 39th). The technique is an IC (module) technique for reducing the parasitic effects by using a flip-chip bonding technique termed micro-bump bonding (hereinafter referred to as MBB), which enables a high-performance millimeter-wave IC to be implemented at low cost with some design flexibility, while taking advantage of the preciseness and manufacturability of the semiconductor fabrication process.

FIG. 32 is a cross-sectional view partially showing the structure of the MFIC, in which are shown: a substrate 1000 composed of Si or the like; a ground conductive film 1001 composed of an Au film formed on the main side of the substrate 1000; a dielectric film 1002 composed of a $SiO_2$ film; and an interconnecting conductive film 1003 composed of a conductive material deposited and patterned on the dielectric film 1002. The interconnecting conductive film 1003, the ground conductive film 1001, and the dielectric film 1002 constitute a microstrip line. In the drawing are also shown: electrode pads 1004 included in the interconnecting conductive film 1003; a semiconductor chip 1008 with an embedded rf transistor composed of a compound semiconductor or the like; and electrode pads 1007 disposed on portions of the semiconductor chip 1008. The electrode pads 1007 are electrically connected to the electrode pads 1004 included in the interconnecting conductive film 1003 of the microstrip line via bumps (microbumps) 1006. A light-light setting insulation resin 105 is used to fix the semiconductor chip 1008 onto the substrate 1000 so that the connection provided by the bumps 1006 is enhanced by the contracting force of the light setting insulation resin 1005.

Next, the process of manufacturing the MFIC shown in FIG. 32 will be described with reference to FIGS. 33(a) to 33(e).

First, as shown in FIG. 33(a), the light setting insulation resin 1005 is supplied dropwise onto the substrate 1000 formed with the microstrip line. Next, as shown in FIG. 33(b), the bumps 1006 formed on the electrode pads 1007 of the semiconductor chip 1008 are aligned with the electrode pads 1004 included in the interconnecting conductive film 1003 on the substrate 1000 by using a camera or the like. Then, as shown in FIG. 33(c), the semiconductor chip 1008 is pressed by means of a pressing jig 1010 to extrude the light setting insulation resin 1005 from the space between the bumps 1006 and the electrode pads 1004, while the bumps 1006 are compressed and deformed to sink into the corresponding electrode pads 1004, thereby establishing connection thereto. Then, as shown in FIG. 33(d), the light setting insulation resin 1005 is cured under the radiation of an ultraviolet ray 1011 to fix the semiconductor chip 1008 onto the substrate 1000. During the curing process, the light setting insulation resin 1005 contracts to provide enhanced connection between the electrode pads 1007 and the electrode pads 1004. Then, as shown in FIG. 33(e), the pressing jig 1010 is removed after the curing process, thereby completing the mounting of the semiconductor chip 1008 on the substrate 1000.

By using the flip-chip mounting technique in accordance with the MBB method described above, the thickness of the bump 1006 can be reduced to th order of several micrometers or less so that the parasitic inductance induced by the intervening bumps 1006 is suppressed to an extremely low level (several picohenries), which renders the MFIC sufficiently usable at frequencies in the millimeter band. In a semiconductor device formed by flip-chip mounting employing a solder bump, the size of the bump is as large as about 50 $\mu$m so that the bump functions as a distributed constant circuit or an inductor. On the other hand, in the MFIC formed by using flip-chip mounting in accordance with the MBB method, the thickness of the bump 1006 can be reduced to the order of several micrometers so that the function of the bump 1006 as an inductor is negligible. Moreover, since the microstrip line in the MFIC can be fabricated by using the semiconductor fabrication process, patterning can be performed with higher accuracy than in the case of a normal hybrid IC wherein interconnections are provided on a substrate of alumina or the like by employing a printing technique. Compared with an MMIC (millimeter-wave monolithic IC) similarly using the semiconductor fabrication process, the MFIC achieves a remarkable cost reduction since a passive circuit can be formed on a low-cost substrate of Si or the like, not on a substrate of a compound semiconductor.

Although the MFIC has numerous advantages as described above, it also has the following problems.

The first problem is a large loss in an rf signal when it passes through the microstrip line used in the conventional MFIC. Although a $SiO_2$ film with a low dielectric constant is typically used to compose the dielectric film 1002 shown in FIG. 32, it is difficult to grow the $SiO_2$ film with a large thickness over 10 μm on the underlying ground conductive film composed of Au. In the case of forming a microstrip line with a characteristic impedance of 50Ω, however, the line width W of the microstrip line and the thickness h of the $SiO_2$ are determined to have a relationship substantially represented by W=2 h so that the line width W is inevitably reduced if the $SiO_2$ film is thin. Consequently, the resistance of the line is increased, resulting in a conductor loss. Moreover, the dielectric loss or so-called tanδ of the $SiO_2$ film is as large as about 0.03. The large conductor loss and large dielectric loss combine to increase a loss in the rf signal passing through the microstrip line.

If any material that may form a film with a large thickness over 10 μm is used properly to compose the dielectric film, the line width can be increased and the conductor loss can be reduced, though the impedance remains the same. To form such a comparatively thick insulating film by a simple procedure, there is known a technique for forming an organic film of polyimide or the like that has been used for an interlayer insulating film of multilayer interconnections or a passivation film of an LSI. The technique enables the formation of a comparative thick dielectric film by a simple process including a spin-coating step and a baking step. By repeatedly performing these steps to stack multiple layers on the resulting dielectric film, a thicker film may be obtained. Moreover, since an organic film has a texture softer than that of an inorganic film, the substrate undergoes only a reduced stress even when the film thickness is increased so that the cracking or peeling off of the film due to a difference in coefficient of thermal expansion between the organic film and the substrate is easily prevented.

It is therefore a first object of the present invention to provide a semiconductor device with an embedded rf transistor wherein the dielectric film of the microstrip line is composed of an organic material particularly suitable for that purpose, which optimizes the impedance and prevents an increase in conductor loss.

However, if the organic film is used to compose the dielectric film of the microstrip line in the MFIC, the MFIC presents the second problem that the characteristics exhibited thereby may not be the same as assumed at the designing stage, though the conductor loss can be reduced. When the semiconductor chip 1008 is pressed against the substrate 1000 by means of the pressing jig in the step of mounting the semiconductor chip 1008 on the substrate 1000 via the bumps 1006, the dielectric film 1002 having a soft texture is deformed under the electrode pads 1004. Variations in the thickness of the dielectric film 1002 in the positions corresponding to the electrode pads 1004 cause the deviation of the line impedance from a value assumed at the designing stage, so that it becomes difficult to implement exactly the same performance assumed at the designing stage.

It is therefore a second object of the present invention to provide an MFIC having a microstrip line using a soft, thick dielectric film composed of an organic film or the like yet exhibiting exactly the same characteristic impedance assumed at the designing stage by providing a means for suppressing the deformation of the dielectric film during MBB mounting.

If the dielectric film is composed of a BCB film, the MFIC presents the third problem that the BCB film peels off the ground conductive film, the interconnecting conductive film peels off the BCB film, cracking occurs in the BCB film, or thermal deformation occurs during the manufacturing process. Close investigation has been conducted on the cause of the third problem, proving that unsatisfactory adhesion between the BCB film and the conductive film or the low heat resistance of the BCB film causes the third problem.

It is therefore a third object of the present invention to provide a highly reliable semiconductor device with excellent rf properties and a method of manufacturing the same by providing a means for compensating for the unsatisfactory adhesion and low heat resistance of the BCB film, while taking advantage of the excellent rf properties of the BCB film.

SUMMARY OF THE INVENTION

To attain the above first object, the present invention provides the following first and second semiconductor devices.

The first semiconductor device according to the present invention comprises: a substrate having an underlying conductive film on at least one portion thereof; a dielectric film composed of a benzocyclobutene (hereinafter referred to as BCB) film formed on the underlying conductive film; an interconnecting conductive film formed on the dielectric film; a semiconductor chip having an rf transistor and an electrode connected to the rf transistor, the semiconductor chip being mounted on the substrate by face-down bonding; and a bump interposed between the electrode and the interconnecting conductive film to provide connection therebetween, wherein the underlying conductive film, the dielectric film, and the interconnecting conductive film compose a microstrip line.

The benzocyclobutene (BCB) mentioned above is a compound represented by the chemical formula shown in FIG. 2(*a*). The BCB film is defined as a film containing in its structure the BCB obtained by dissolving BCB-DVS monomer in a solvent, applying the resulting solution, and baking the applied solution. It has been proved that the BCB film has a low dielectric constant of about 2.7 and can easily have a large thickness of about 30 μm by only one application. According to the measurements conducted by the present inventors, the BCB film had a tanδ of about 0.006 at 60 GHz, which is smaller than the tanδ of a $SiO_2$ film by one order of magnitude. Hence, by using the BCB film for the dielectric film of the strip line for radio frequencies, the conductor loss and the dielectric loss are held small so that a loss in an rf signal passing through the strip line is also reduced.

The second semiconductor device according to the present invention comprises: a substrate having an underlying conductive film on at least one portion thereof; a first dielectric film composed of a BCB film formed on the underlying conductive film; a first interconnecting conductive film formed on the first dielectric film; a second dielectric film composed of an insulating film formed on the first interconnecting conductive film; a second interconnecting conductive film formed on the second dielectric film; a semiconductor chip having an rf transistor and an electrode connected to the rf transistor, the semiconductor chip being mounted on the substrate by face-down bonding; and a bump interposed between the electrode and the second interconnecting conductive film to provide connection therebetween, wherein the underlying conductive film, the first dielectric film, and the first interconnecting conductive film compose a microstrip line and the first interconnecting conductive film, the second dielectric film, and the second interconnecting conductive film compose a MIM capacitor.

What results is a multilayer structure consisting of the strip line and the MIM capacitor using the second interconnecting conductive film in common, so that the area occupied by the semiconductor device is accordingly reduced.

To attain the above second object, the present invention also provides the following third semiconductor device.

The third semiconductor device according to the present invention comprises: a substrate having an underlying conductive film on at least one portion thereof; a dielectric film formed on the underlying conductive film; an interconnecting conductive film formed on the dielectric film, the interconnecting conductive film in conjunction with the underlying conductive film and the dielectric film composing a microstrip line; a semiconductor chip having an rf transistor and an electrode connected to the rf transistor, the semiconductor chip being mounted on the substrate by face-down bonding such that the electrode is connected to a portion of the interconnecting conductive film on the substrate; and a bump provided in a connecting portion between the electrode and the interconnecting conductive film to provide connection therebetween, wherein after the semiconductor chip is mounted on the substrate, a variation caused by the mounting of the semiconductor chip in the distance between the bottom surface of the semiconductor chip and the top surface of the dielectric film in said connecting portion is larger than a variation caused by the mounting of the semiconductor chip in the thickness of the dielectric film under the connecting portion.

In the connecting portion between the electrode and the interconnecting conductive film, variations in the thickness of the dielectric film below the bumps and in their vicinities are therefore suppressed in mounting the semiconductor chip on the substrate, while variations in the thickness of finished dielectric films are also suppressed. Accordingly, there can be obtained a semiconductor device having a microstrip line with a characteristic impedance substantially the same as a characteristic impedance assumed at the designing stage. In an rf module operating at radio frequencies, in particular, there can be implemented a structure which enables precise control of characteristics. Moreover, the occurrence of misoperation due to impedance dismatching can be prevented.

The dielectric film may be composed an organic material containing at least any of BCB, polyimide, and acrylic.

In addition to the effects described above, the arrangement enables easy formation of a dielectric film having a comparatively large thickness of about 20 to 30 $\mu$m so that a semiconductor device having a microstrip line with a large width and a characteristic impedance of about 50$\Omega$ is provided.

Preferably, the variation in the thickness of the dielectric film when at least one of the bump and the electrode is deformed by compression till the amount of deformation thereof is saturated is 10% or less.

In the state in which the amount of deformation is saturated, the bump or electrode has been work hardened in the direction of compression so that substantially no more plastic deformation occurs.

In addition to the above effects, the distance between the semiconductor chip and the interconnecting conductive film can also be adjusted precisely so that the inductance of the bump is minimized, while the impedance of the interconnecting conductive film in the vicinity of the bump can be held constant.

At least one of the electrode and the interconnecting conductive film may be provided with a dummy pad for reducing impact load which does not contribute to signal transmission or power supply.

This allows the distribution of the load in mounting the semiconductor chip on the substrate, so that the load placed on one bump in connecting the electrode to the interconnecting conductive film is reduced. As a result, even when the minimum load that can be placed by the pressing apparatus used to implement the semiconductor device is limited to a relatively high value, the load can be adjusted so that no extra load is placed on the bump. Consequently, the impact load placed on the dielectric film underlying the bump is reduced, which reduces the amount of deformation of the dielectric film.

Preferably, the dummy pads for reducing impact load are disposed on the periphery of the semiconductor chip.

This allows the dummy pads for reducing the impact load to be arranged symmetrically on the semiconductor chip, so that the stress in mounting the semiconductor chip is excellently balanced. As a result, the connection between the electrode and the interconnecting conductive film is improved, while the amount of deformation of the dielectric film is further reduced.

There may further be provided a dummy bump interposed between the semiconductor chip and the interconnecting conductive film, the dummy bump not contributing to signal transmission or power supply.

This allows the distribution of the load in mounting the semiconductor chip on the substrate. As a result, even when the minimum load that can be placed by the pressing apparatus used to implement the semiconductor device is limited to a relatively high value, the load can be adjusted so that no extra load is placed on the bump.

Preferably, the bump has a thickness of 5 $\mu$m or less after the semiconductor chip is mounted.

Accordingly, there can be provided a semiconductor device in which a parasitic inductance can particularly be reduced to a negligible value.

The semiconductor chip can be adhered to the substrate by means of a light setting contractive insulation resin provided in a region including the connecting portion between the electrode and the interconnecting conductive film.

In the arrangement, a compressive stress is applied to the connecting portion between the electrode and the interconnecting conductive film, so that the connection therebetween is further enhanced.

In the connecting portion between the electrode and the interconnecting conductive film, a buffer layer composed of a material having a Young's modulus smaller than that of the dielectric film may be provided under at least one of the electrode and the interconnecting conductive film.

In the arrangement, when a pressing force is applied to the connecting portion in mounting the semiconductor chip, the buffer layer is preferentially deformed so that the bump is compressively deformed substantially to saturation before the amount of deformation of the dielectric film becomes large. Consequently, the force instantaneously applied to the dielectric film is reduced, which in turn suppresses the deformation of the dielectric film.

In the connecting portion between the electrode and the interconnecting conductive film, a hollow portion may be provided under at least one of the electrode and the interconnecting conductive film.

The bump may have at least one void in the inside thereof.

In the arrangements, when the bump is pressed in mounting the semiconductor chip, the bump is deformed by compression before the dielectric film undergoes the pressing force and is thereby deformed. Consequently, the pressing force applied instantaneously to the dielectric film is reduced, which in turn suppresses the deformation of the dielectric film.

There may be provided supports disposed on at least two separate portions of the semiconductor chip in the vicinity of the connecting portion in such a manner as to sandwich the connecting portion therebetween, the supports being composed of a material having a Young's modulus larger than that of the material composing the dielectric film and having a height larger than the total thickness of the electrode, the bump, and the interconnecting conductive film.

In mounting the semiconductor chip in the arrangement, the supports are brought into contact with and presses the dielectric film on the substrate before the pressing force is applied to the bump. The applied pressure produces a stress in such a direction as to increase the thickness of the dielectric film underlying the connecting portion, so that a balance is achieved between the stress and a stress exerted by the pressing jig and acting on the dielectric film via the interconnecting conductive film in mounting the semiconductor chip, which suppresses the deformation of the dielectric film.

To attain the above third object, the present invention provides a fourth semiconductor device.

The fourth semiconductor device according to the present invention comprises a wiring board having a substrate and a dielectric film formed on the substrate, wherein the dielectric film comprises: a benzocyclobutene film (hereinafter referred to as a BCB film) formed on at least one portion of the substrate; and an insulating thin film formed at least on or beneath the BCB film.

In the arrangement, the multilayer film composed of the main BCB film and the subordinate insulating thin film forms an excellent dielectric film which exhibits excellent adhesion to the overlying or underlying conductive film, high resistance to heat, and high resistance to impact load. Accordingly, there can be implemented a variety of semiconductor devices utilizing the dielectric films.

There may further be provided a conductive film formed on the side of the insulating thin film opposite to the BCB film.

Accordingly, a microstrip line using the dielectric film composed of the BCB film having high heat resistance and excellent adhesion to the conductive film can be obtained.

A fifth semiconductor device is the above fourth semiconductor device wherein the conductive film is an underlying conductive film formed on or beneath the substrate and the BCB film is formed on the underlying conductive film, the semiconductor device further comprising an interconnecting conductive film formed on the side of the BCB film and the insulating thin film opposite to the underlying conductive film, the underlying conductive film, the BCB film, the insulating thin film, and the interconnecting conductive film composing a microstrip line.

Accordingly, there can be obtained a microstrip line having a BCB film with improved adhesion and heat resistance, a small dielectric loss, and a small conductor loss.

There are further provided: a semiconductor chip having a transistor; a signal interconnect formed on a surface of the semiconductor chip and connected to the transistor; and a bump formed on at least one of the signal interconnect and the interconnecting conductive film, wherein the signal interconnect on the semiconductor chip can be connected to the interconnecting conductive film via the bump.

Accordingly, there can be obtained an MFIC having a microstrip line having the foregoing excellent properties.

In the case where the insulating thin film is formed at least between the BCB film and the interconnecting conductive film, there may further be provided a thin-film resistor formed on the insulating thin film.

In the MFIC, the insulating thin film can reduce the thermal impulse resulting from the heat generated from the thin-film resistor and acting on the BCB film, while the miniaturization of the semiconductor chip is further pursued with the provision of the resistor on the substrate side.

The insulating thin film may be formed at least between the BCB film and the interconnecting conductive film and a pad region connected to an external member via a wire may be formed in a portion of the interconnecting conductive film.

In bonding wires to the pad region of the interconnecting conductive film, the insulating thin film underlying the interconnecting conductive film reduces the amount of a bonding pressure absorbed in the BCB film, so that a highly reliable MFIC is obtained.

The above semiconductor device may further comprise a capacitor, wherein the insulating thin film is formed at least between the BCB film and the interconnecting conductive film, the semiconductor device further comprising a lower electrode film of the capacitor provided in a part of the space between the insulating thin film and the BCB film, wherein the interconnecting conductive film functions as an upper electrode of the capacitor over the lower electrode film and the insulating thin film functions as a capacitive portion of the capacitor between the lower electrode film and the interconnecting conductive film and extends to a region not overlying the lower electrode film to be interposed between the interconnecting conductive film and the BCB film.

In the arrangement, the adhesion and heat resistance of the BCB film can be improved by utilizing the insulating thin film serving as the capacitive portion of the capacitor formed on the substrate, resulting in lower manufacturing cost of the MFIC.

A sixth semiconductor device according to the present invention comprises: a substrate; an underlying conductive film formed on the substrate; a BCB film formed on at least a portion of the underlying conductive film; and an interconnecting conductive film formed on the BCB film, the interconnecting conductive film in conjunction with the underlying conductive film and the BCB film composing a microstrip line, wherein the interconnecting conductive film extends to a region over the substrate and uncovered with the BCB film, the region being formed with a pad region connected to an external member via a wire.

In the arrangement, the BCB film is not underlying the pad region with wires so that the interconnecting conductive film does not peel off in the step of wire bonding, resulting in an MFIC having a microstrip line using the BCB film and having a small dielectric loss and a small conductor loss.

A major part of the underlying conductive film may function as a ground conductive film and a portion of the underlying conductive film may be separated from the major part and a pad region of the interconnecting conductive film may be formed on the portion of the underlying conductive film.

In the arrangement, the underlying conductive film serving as the ground conductive film can extensively be used as the underlie of the interconnecting conductive film in the pad region.

A seventh embodiment of the present invention comprises: a substrate composed of a semiconductor; an isolation composed of an insulating material and formed on the substrate; an underlying conductive film formed on the substrate; a BCB film formed on a region overlying at least a part of the underlying conductive film and not including the isolation; and an interconnecting conductive film formed on the BCB film, the interconnecting conductive film in conjunction with the underlying conductive film and the BCB film composing a microstrip line, wherein the interconnecting conductive film extends to a region over the isolation, the region being formed with a pad region connected to an external member via a wire.

Accordingly, there can be obtained an MFIC having a pad region insulated from a ground conductive film by utilizing an isolation required in the case of forming a semiconductor device on a semiconductor substrate.

An eighth embodiment of the present invention comprises: a substrate in the form of a wafer; an underlying conductive film formed on the substrate; a BCB film formed on at least one portion of the underlying conductive film; and an interconnecting conductive film formed on the BCB film, the interconnecting conductive film in conjunction with the underlying conductive film and the BCB film composing a microstrip line, wherein the BCB film is not present on a region of the substrate to be scribed for dividing the substrate into a plurality of substrate chips, the BCB film being divided into segments corresponding to the individual substrate chips.

In the process of manufacturing the semiconductor device in the arrangement, the BCB film does not wind around the cutting blade during dicing, resulting in longer lifetime of the cutting blade and reduced cost.

To attain the above second object, the present invention provides the following first to fourth methods of manufacturing semiconductor devices.

The first method of manufacturing a semiconductor device according to the present invention comprises: a first step of depositing an underlying conductive film on a substrate; a second step of forming a dielectric film composed of an organic resin on the underlying conductive film; a third step of forming an interconnecting conductive film on the dielectric film such that the underlying conductive film, the dielectric film, and the interconnecting conductive film compose a microstrip line; a fourth step of preparing a semiconductor chip having an rf transistor and an electrode connected to the transistor; a fifth step of forming a bump on a surface of at least one of the electrode and the interconnecting conductive film; a sixth step of opposing the electrode of the semiconductor chip to the interconnecting conductive film of the substrate to align the electrode with the interconnecting conductive film in a connecting portion between the semiconductor chip and the substrate; and a seventh step of providing contact between the electrode and the interconnecting conductive film via the bump and pressing the semiconductor chip downward while applying a heat thereto so as to compressively deform the bump till the amount of deformation thereof is substantially saturated, wherein in the fifth step, the bump is formed from a material having such a characteristic that the amount of deformation of the bump is substantially saturated when a variation in the thickness of the dielectric film in the seventh step is 10% or less.

In accordance with the method, the dielectric film comparatively thick can be formed on the underlying conductive film by applying the organic resin film in a reduced number of steps. Moreover, in mounting the semiconductor chip on the substrate, the amount of deformation of the bump can be held constant while the variation in the thickness of the dielectric film below the bump and its vicinity can be reduced to 10% or less, which enables easy adjustment of the impedance of the interconnecting conductive film in the vicinity of the bump to have a value exactly the same as assumed at the designing stage. Accordingly, there can be manufactured a low-cost semiconductor device having the advantages of rf properties with reduced variations and immunity to misoperation resulting from impedance dismatching.

The second method of manufacturing a semiconductor device according to the present invention comprises: a first step of depositing an underlying conductive film on a substrate; a second step of forming a dielectric film composed of an organic resin on the underlying conductive film; a third step of forming an interconnecting conductive film on the dielectric film such that the underlying conductive film, the dielectric film, and the interconnecting conductive film compose a microstrip line; a fourth step of preparing a semiconductor chip having an rf transistor and an electrode connected to the transistor; a fifth step of forming a bump on a surface of at least one of the electrode and the interconnecting conductive film; a sixth step of placing the substrate with the interconnecting conductive film facing upward and coating the top surface of the substrate with a liquid insulating resin having a curing/contracting function; a seventh step of opposing the electrode of the semiconductor chip to the interconnecting conductive film of the substrate to align the electrode with the interconnecting conductive film in a connecting portion between the semiconductor chip and the substrate; and an eighth step of providing contact between the electrode and the interconnecting conductive film via the bump and pressing the semiconductor chip downward while applying a heat thereto so as to compressively deform the bump till the amount of deformation thereof is substantially saturated; and a ninth step of curing the insulating resin, wherein in the fifth step, the bump is formed from a material having such a characteristic that the amount of deformation of the bump is substantially saturated when a variation in the thickness of the dielectric film in the eighth step is 10% or less.

The method achieves the same effects as achieved by the first method of manufacturing a semiconductor device.

The third method of manufacturing a semiconductor device according to the present invention comprises: a first step of depositing an underlying conductive film on a substrate; a second step of forming a dielectric film composed of an organic resin on the underlying conductive film; a third step of forming an interconnecting conductive film on the dielectric film such that the underlying conductive film, the dielectric film, and the interconnecting conductive film compose a microstrip line; a fourth step of preparing a semiconductor chip having an rf transistor and an electrode connected to the transistor; a fifth step of forming a bump on a surface of at least one of the electrode and the interconnecting conductive film; a sixth step of placing the substrate with the interconnecting conductive film facing upward and coating the top surface of the substrate with a liquid insulating resin having a curing/contracting function; a seventh step of opposing the electrode of the semiconductor chip to the interconnecting conductive film of the substrate to align the electrode with the interconnecting conductive film in a connecting portion between the semiconductor chip and the substrate; and an eighth step of providing contact between the electrode and the interconnecting conductive film via the bump and pressing the semiconductor chip downward while applying a heat thereto so as to compressively deform the bump till the amount of deformation thereof is substantially saturated; and a ninth step of curing the insulating resin, wherein the bump is softened to be compressively deformed substantially at the same time as the semiconductor chip is pressed downward in the eighth step.

In accordance with the method, when the bump is to be deformed by compression, heat is applied only to the bump so that it is softened, which extremely facilitates the mounting of the semiconductor chip while hardly deforming the underlying dielectric film. Consequently, the same effects as achieved by the first method of manufacturing a semiconductor device can be achieved more easily.

The bump is formed by using a metal containing Au in the fifth step and an ultrasonic wave is applied to the space between the semiconductor chip and the substrate substantially concurrently with pressing in the eighth step.

The bump is formed by using a metal containing Au in the fifth step and an electromagnetic wave is applied to the bump substantially concurrently with pressing in the eighth step.

In accordance with the methods, when the semiconductor chip is mounted on the substrate, only the bump can be deformed easily while pressing the semiconductor chip.

The fourth method of manufacturing a semiconductor device according to the present invention comprises: a first step of depositing an underlying conductive film on a substrate; a second step of forming a dielectric film composed of an organic resin on the underlying conductive film; a third step of forming an interconnecting conductive film on the dielectric film such that the underlying conductive film, the dielectric film, and the interconnecting conductive film compose a microstrip line; a fourth step of preparing a semiconductor chip having an rf transistor and an electrode connected to the transistor; a fifth step of forming a bump on a surface of at least one of the electrode and the interconnecting conductive film; a sixth step of placing the substrate with the interconnecting conductive film facing upward and coating the top surface of the substrate with a liquid insulating resin having a curing/contracting function; a seventh step of opposing the electrode of the semiconductor chip to the interconnecting conductive film of the substrate to align the electrode with the interconnecting conductive film in a connecting portion between the semiconductor chip and the substrate; and an eighth step of providing contact between the electrode and the interconnecting conductive film via the bump and pressing the semiconductor chip downward while applying a heat thereto so as to compressively deform the bump till the amount of deformation thereof is substantially saturated; and a ninth step of curing the insulating resin, wherein the portion of the dielectric film underlying the bump is formed to have a thickness larger than the thickness of the other portion thereof in the second step and the semiconductor chip is pressed till the thickness of the dielectric film is substantially equalized in the eighth step.

The method also provides the dielectric film which has a substantially equal thickness after the semiconductor chip is mounted. Accordingly, there can be provided a semiconductor device comprising a microstrip line having an impedance substantially the same as assumed at the designing stage, similarly to the first method of manufacturing a semiconductor device.

To attain the above third object, the present invention provides the following fifth and sixth methods of manufacturing semiconductor devices.

The fifth method of manufacturing a semiconductor device according to the present invention comprises: a first step of forming an underlying conductive film on a substrate; a second step of forming a BCB film on at least a portion of the underlying conductive film; a third step of forming an interconnecting conductive film on the BCB film; and a step of forming an insulating thin film on or beneath the BCB film at least before or after the second step.

The method prevents the BCB film from peeling off the underlying conductive film, while preventing the interconnecting conductive film from peeling off the BCB film, during the manufacturing process.

A step of forming a contact hole for partially exposing the underlying conductive film in a desired position of the BCB film and the insulating film after the second step and before the third step; and a step of forming a metal buried layer by filling a metal in the contact hole, wherein the interconnecting conductive film is formed to be connected to the metal buried layer in the third step.

In that case, the metal buried layer is formed by selective plating using the underlying conductive film exposed in the contact hole as a seed metal in the step of forming the metal buried layer.

In accordance with the method, the buried metal layer can easily be formed even in the case where a contact hole having a large aspect ratio, i.e., a contact hole having a small cross-sectional area and a large depth is needed, which facilitates the formation of interconnections.

In the above first method of manufacturing a semiconductor device, the sixth method of manufacturing a semiconductor device according to the present invention further comprises: a step of preparing a semiconductor chip having a transistor and a single interconnect connection to the transistor; a step of forming a bump on a desired portion of at least one of the interconnecting conductive film and the signal interconnect; and a step of connecting the signal interconnect on the semiconductor chip to the interconnecting conductive film via the bump.

The method enables the formation of an MFIC having a strip line composed of a multilayer film consisting of a BCB film with excellent adhesion and heat resistance and an insulating thin film.

There may further be provided a dicing step of dividing the substrate into a plurality of substrate chips, wherein the BCB film can be formed in the second step such that the BCB film is not present in a region to be scribed in the dicing step.

BRIEF DESCRIPTION OF THE DRAWINGS

FIGS. 21(a) and 21(b) are views showing respective adhesions of the individual films in the MFIC according to the twelfth embodiment;

DETAILED DESCRIPTION OF THE INVENTION (First Embodiment)

A first embodiment relates to a structure for improving the material of a dielectric film.

Figure 1:
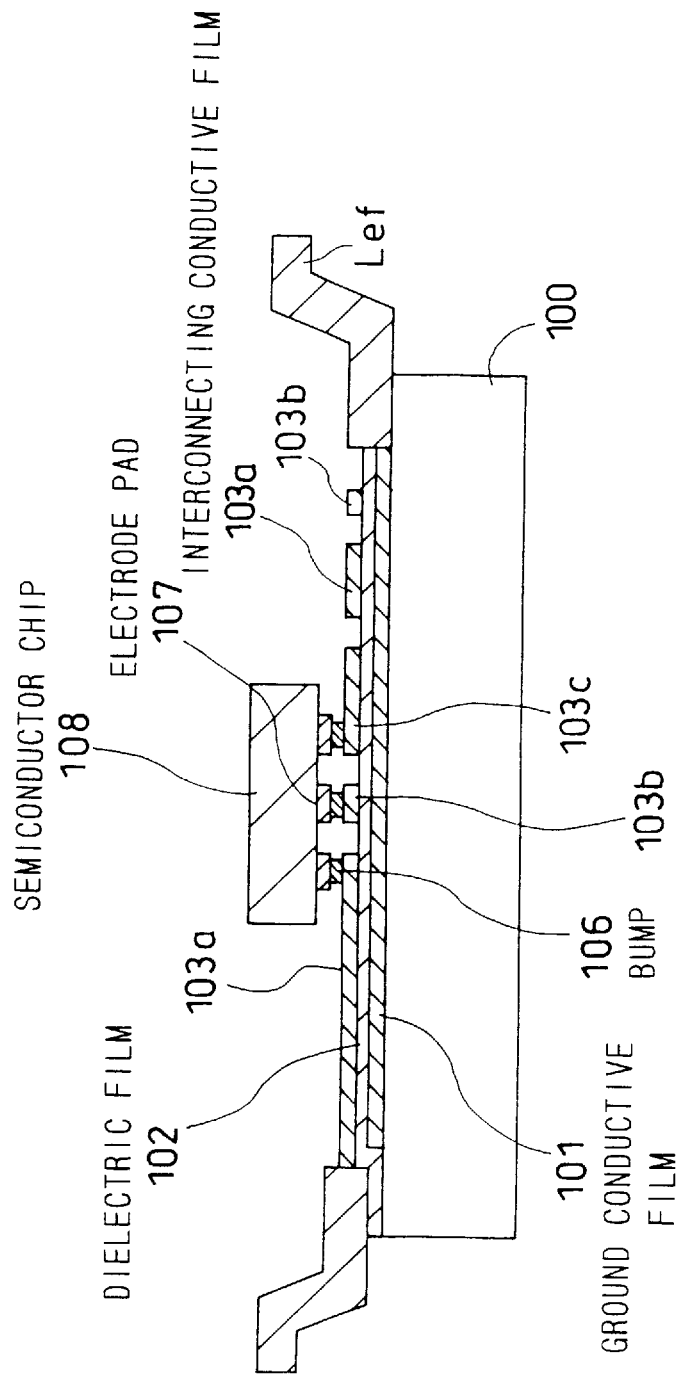
FIG. 1 is a cross-sectional view of an MFIC according to a first embodiment.

FIG. 1 is a cross-sectional view of a semiconductor device according to the first embodiment, in which are shown: a substrate 100 composed of glass or Si; a ground conductive film 101 composed of a multilayer film of Ti and Au formed on the substrate 100; a dielectric film 102 composed of benzocyclobutene (hereinafter referred to as BCB), which will be described later; and interconnecting conductive films 103a to 103c composed of titanium, gold, and the like stacked in layers on the dielectric film 103. Of the interconnecting conductive films 103a to 103c, the interconnecting conductive film 103a, the ground conductive film 101, and the dielectric film 102 interposed therebetween constitute a MIM-type capacitor. The interconnecting conductive film 103b, the ground conductive film 101, and the dielectric film 102 constitute a microstrip line. The interconnecting conductive film 103c is an interconnection that should be grounded so that it is connected to the ground conductive film 101 through a contact hole (not shown).

In the drawing are also shown: a semiconductor chip 108 with an rf transistor having an operating frequency of 30 GHz mounted thereon; electrode pads 107 on the semiconductor chip 108; and bumps 106 for connecting the interconnecting conductive films 103a to 103c to the electrode pads 107. In the present embodiment, the semiconductor chip 108 is connected by flip-chip mounting to the substrate 100 via the bumps 106 between the electrode pads 107 and the interconnecting conductive films 103a to 103c. Leadframes Lef for mounting are attached onto the substrate 100 when necessary.

Figure 2A:
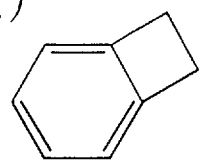
FIGS. 2(a) to 2(c) are respective views showing the chemical formula of BCB, the chemical formula of BCB monomer, and the structure of BCB polymer.
Figure 2B:
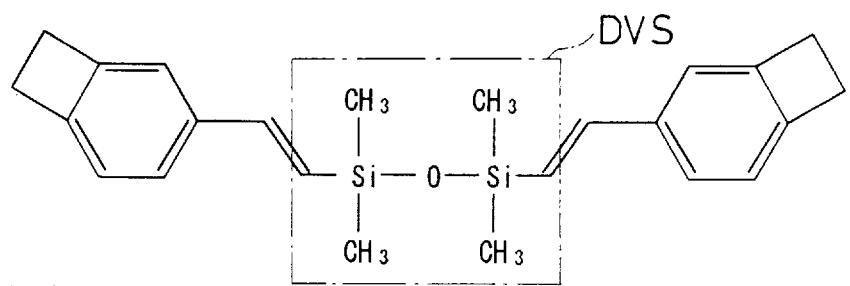
Figure 2C:
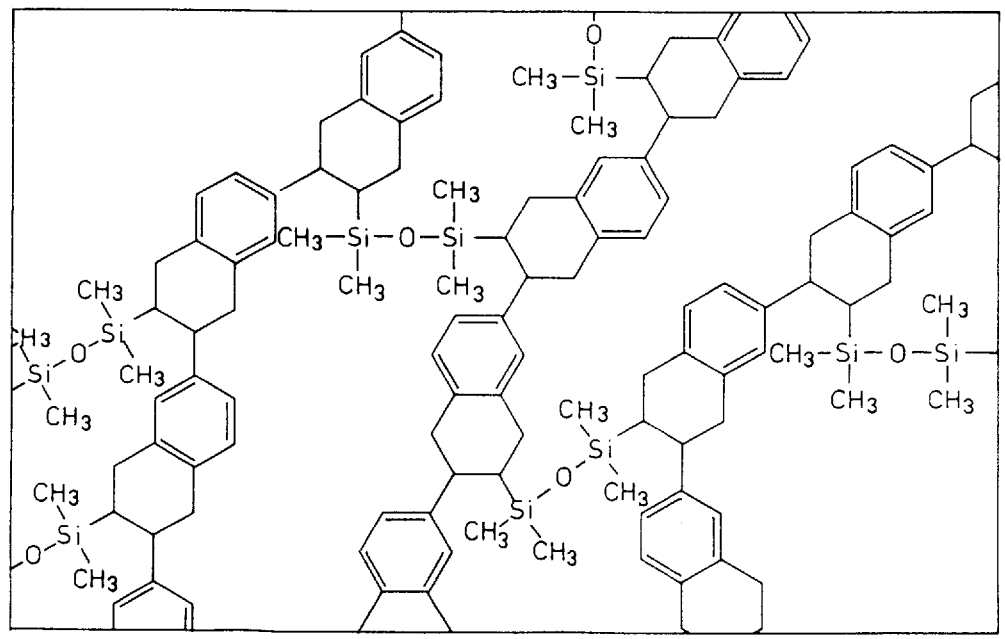

Referring now to FIGS. 2(a) to 2(c), a description will be given to a BCB film composing the dielectric film 102 which characterizes the present embodiment.

FIG. 2(a) shows the chemical structural formula of BCB. FIG. 2(b) shows the chemical structural formula of DVS-BCB monomer containing BCB, which is commercially available as CYCLOTENE 5021 (or CYCLOTENE 3022) from The Dow Chemical Co. and has a structure in which DVD is interposed between two BCBs. The DVS-BCB monomer is dissolved in a solvent to prepare an oligomer solution, which is then applied onto the substrate and baked in an $N_2$ atmosphere at 250° C. for 60 minutes, resulting in a BCB film having a crosslinked structure as shown in FIG. 2(c). According to the present invention, a resin film obtained by polymerizing the BCBs shown in FIG. 2(a) is generally termed a BCB film and is not limited to the resin film represented by the chemical formula shown in FIG. 2(c).

Since the MFIC according to the present embodiment has such a structure that a microstrip line can be formed by using not a printing technique as used in a hybrid IC but a normal semiconductor fabrication process, the patterning accuracy is improved. Moreover, since the substrate 100 is composed of Si or glass, the manufacturing cost is reduced compared with the manufacturing cost of a conventional MMIC. Furthermore, since the size of the bump can be minimized to the order of several micrometers, the parasitic inductance can be reduced to a negligible value even when the bump is used to mount a semiconductor chip with an embedded rf transistor using a signal in the millimeter-wave band.

In addition, since the dielectric film 102 composed of a BCB film can easily be formed to have a thickness of about 30 $\mu$m by only one application, the line width of the interconnecting conductive film can be increased in the present embodiment. Moreover, according to the measurements obtained by the present inventors, the BCB film had a low dielectric constant of about 2.7 and a dielectric loss tan$\delta$ of about 0.006 at 60 GHz, which is smaller than the dielectric loss tan$\delta$ of the SiO$_2$ by one order of magnitude. By thus using the BCB film to compose the dielectric film of the strip line for rf frequencies, a microstrip line having a small conductor loss and a small dielectric loss can be formed, which greatly reduces a loss in an rf signal passing therethrough.

Although it has been assumed that the single semiconductor chip 108 is mounted on the substrate 100 for the sake of convenience in the present embodiment, a plurality of semiconductor chips may be mounted on a single substrate or, alternatively, a plurality of transistors may be provided on a single semiconductor chip. The same shall apply to the individual embodiments which will be described later.

(Second Embodiment)

Figure 3:
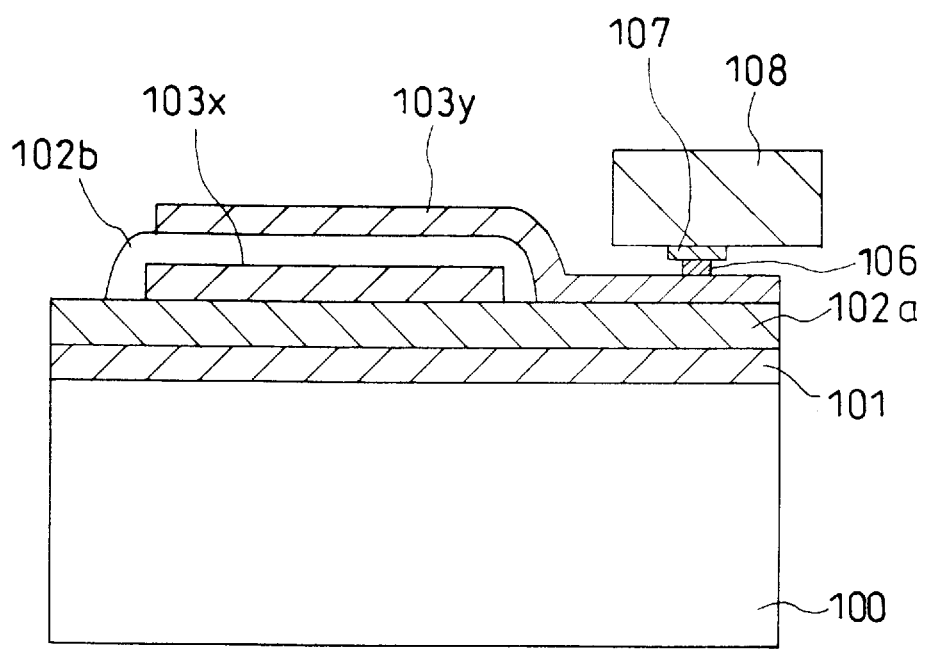
FIG. 3 is a cross-sectional view partially showing an MFIC according to a second embodiment.

FIG. 3 is a cross-sectional view of an MFIC according to a second embodiment. As shown in the drawing, a ground conductive film 101 composed of Au and having a thickness of about 1 $\mu$m is deposited on a substrate 100 composed of Si and having a thickness of about 300 $\mu$m in the present embodiment. On the ground conductive film 101, there is deposited a first dielectric film 102a composed of a BCB film having a thickness of about 25 $\mu$m. On the first dielectric film 102a, there is formed a first interconnecting conductive film 102x having a thickness of about 1 $\mu$m and consisting of multilayer films of Ti and Au. The ground conductive film 101, the first dielectric film 102a, and the first interconnecting conductive film 102x constitute a microstrip line.

The present embodiment is characterized in that a second dielectric film 102b composed of a silicon nitride film (or silicon dioxide film) having a thickness of about 500 nm is deposited on the first interconnecting conductive film 102x and the first dielectric film 102a. On the second dielectric film 102b, there is formed a second interconnecting conductive film 103y. The first interconnecting conductive film 102x, the second dielectric film 102b, and the second interconnecting conductive film 102y constitute a MIM capacitor.

The above second interconnecting conductive film 102y is connected to electrode pads 107 of a semiconductor chip 108 via bumps 106.

According to the present embodiment, the microstrip line and the MIM capacitor are three-dimensionally constituted so as to use the first interconnecting conductive film 102x in common, which achieves a reduction in the area occupied by passive elements in the MFIC and the miniaturization of the MFIC.

(Third Embodiment)

A description will be given to a basic means used in the third and subsequent embodiments of the present invention. The deformation of the dielectric film during MBB mounting in the conventional MFIC as described above may be attributed to the high acceleration speed at which the pressing jig presses so that the pressing force is transmitted to the dielectric film before the bumps are deformed by compression. When a variation in the thickness of the dielectric film is small (10% or less), if the material of the bumps or pads and the load placed thereon can be controlled such that the bumps or pads are compressively deformed till the amount of elastic deformation of the bumps or pads is saturated, variations in the thickness of the dielectric film can be minimized. To compressively deform the bumps before the force is transmitted to the dielectric film, pressing should be performed at a minimum speed or a minimum load should be placed. However, since the function of controlling the pressing speed and pressing force of the pressing apparatus is limited, it has been proved that variations in the thickness of the dielectric film cannot effectively be prevented merely by controlling the pressing apparatus. Therefore, each of the following embodiments will describe a method of suppressing the deformation of the dielectric film by improving the structure of the bump or pad.

Figure 4:
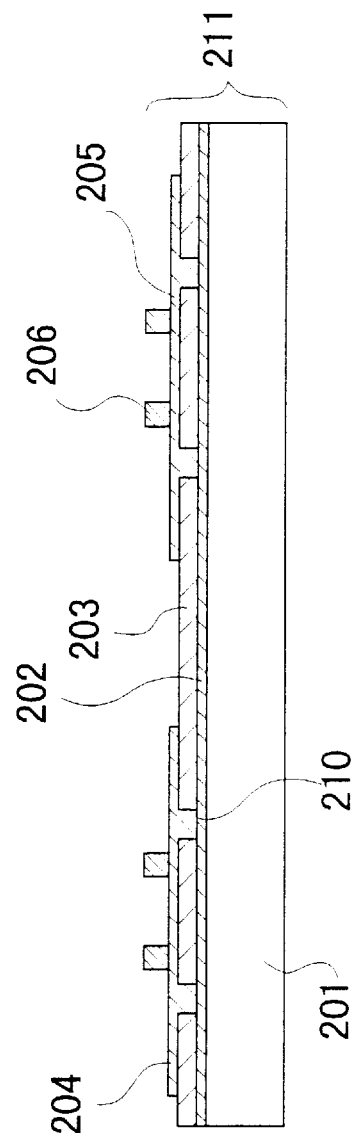
FIG. 4 is a cross-sectional view of a wiring board according to a third embodiment.

First, the third embodiment will be described with reference to the drawings. FIG. 4 is a cross-sectional view of a wiring board according to the third embodiment, in which are shown: a silicon substrate 201; a ground conductive film 202 composed of a Ti/Au/Ti multilayer film; a dielectric film 203 composed of an organic insulating film such as a BCB film; an interconnecting conductive film 204 composed of Au; electrode pads 205 of the interconnecting conductive film 204; bumps 206 composed of Au; and a through hole 210 formed in a desired portion of the dielectric film 203. The foregoing members constitute the wiring board 211 as a circuit board. Briefly, the wiring board 211 has the dielectric film 203 on the ground connecting film 202 serving as a conductor and the interconnecting conductive film 204 is provided on the dielectric film 203.

Figure 5:
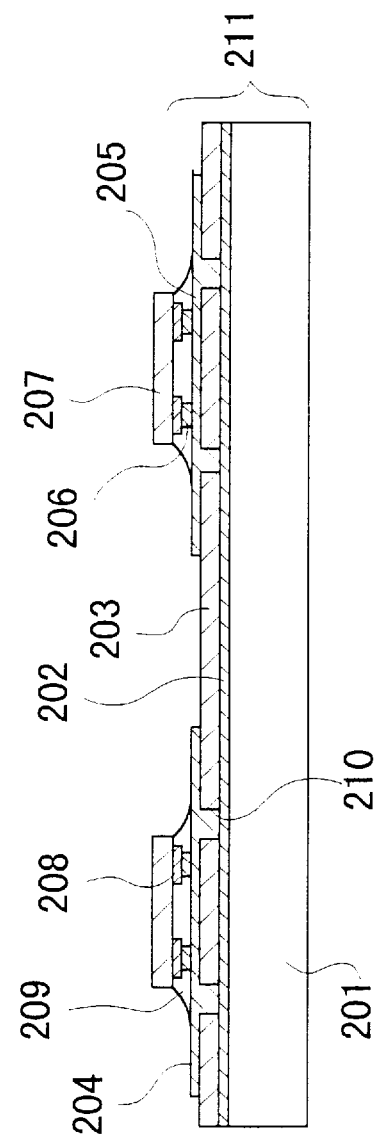
FIG. 5 is a cross-sectional view of an MFIC according to the third embodiment.

FIG. 5 is a cross-sectional view of an rf module formed by using the wiring board 211. As shown in the drawing, a semiconductor chip 207 with an embedded rf transistor is mounted on the wiring board 211 and electrode pads 208 on the semiconductor chip 207 are connected to the interconnecting conductive film 204 on the wiring board 211 via the bumps 206.

As will be described later, the present embodiment is characterized in that the bumps 206 having a hardness lower than that of the dielectric film 203 are used so that the amount of plastic deformation of the bumps caused by the pressing force applied in mounting the semiconductor chip 207 becomes larger than the amount of elastic deformation of the dielectric film 203.

FIGS. 6(a) to 6(f) are cross-sectional views illustrating the process of manufacturing the rf module in the present embodiment.

Figure 6:
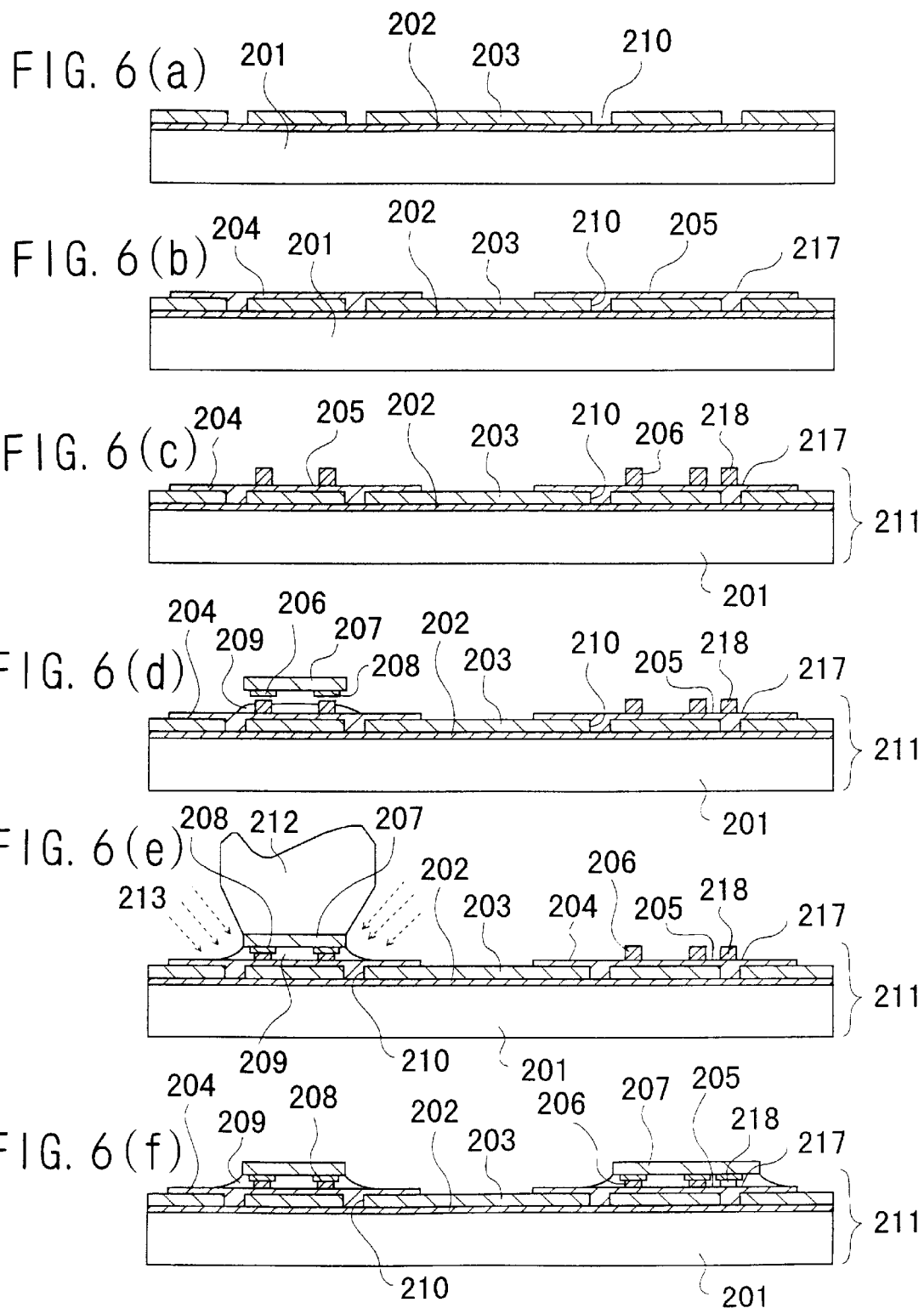
FIGS. 6(a) to 6(f) are cross-sectional views illustrating the process of manufacturing the MFIC according to the third embodiment.

First, as shown in FIG. 6(a), the ground conductive film 202 composed of the Ti/Au/Ti multilayer film is formed by vapor deposition on the silicon substrate 201, followed by coating the top surface of the ground conductive film 202 with a BCB film by spin coating, which is then subjected to soft curing and hard curing to form the dielectric film 203 composed of the BCB film having a desired thickness.

Alternatively, the dielectric film 203 may be formed from an organic insulating material other than BCB such as polyimide or acrylic. Then, the through hole 210 is formed in a desired position by using a photolithographic technique and dry-etching and wet-etching techniques. Alternatively, the through hole 210 may be formed simultaneously with the formation of the dielectric film 203 using photosensitive BCB, polyimide, or the like by using a specific photolithographic technique in combination.

Next, as shown in FIG. 6(b), a seed thin film for plating composed of a Ti/Au multilayer film is formed by a thin-film formation method such as vacuum vapor deposition and the interconnecting conductive film 204 composed of Au and the electrode pads 205 are formed on the seed thin film by using a photolithographic technique and a plating technique such as electrolytic plating, followed by the removal of the seed thin film using an etching technique. If necessary, a dummy pad 217 is formed to form a dummy bump 218, which will be described later.

Next, as shown in FIG. 6(c), the bumps 206 composed of Au and having a desired height are formed on the electrode pads 205 by using the same photolithographic technique and electrolytic plating as used in the preceding step to compose the wiring board 211. Although the bumps 206 are formed on the electrode pads 205 on the wiring board 211, they may also be formed on the electrode pads 208 of the semiconductor chip 207.

Preferably, the bumps 206 are formed to have a minimum hardness by optimizing plating conditions and the like. A specific Vickers hardness preferred for the bumps 206 is 50 Hv or less. If necessary, the dummy bump 218 may be formed simultaneously with the formation of the bumps 206. The dummy bump 218 and the dummy pad 217 are irrelevant to signal transmission and power supply. The dummy bump 218 and the dummy pad 217 are so designed that they can be deformed under a load equal to or less than a minimum load that can be placed on the semiconductor chip 207 by a pressing jig 212 as the pressing apparatus. When the pressing jig 212 is capable of placing only a high load, the dummy bump 218 achieves the effect of distributing the load so that no extra load is placed on the bumps 206.

Then, as shown in FIG. 6(d), a light setting insulation resin 209 is applied onto a desired portion of the circuit board 211 and the semiconductor chip 207 is aligned with the interconnecting conductive film 204 so that the bumps 206 are opposed to the corresponding electrode pads 208 of the semiconductor chip 207 to have electrical connection thereto.

Then, as shown in FIG. 6(e), the pressing jig 212 of the pressing apparatus places such a load on the semiconductor chip 207 as to plastically deform the electrode pads 205 of the wiring board 211 till the amount of deformation thereof caused by compression is substantially saturated. In the meantime, the bumps 206 are also plastically deformed till the amount of deformation thereof caused by compression is substantially saturated. The placement of the load is followed by the radiation of an ultraviolet ray 213 for curing the light setting insulation resin 209.

Then, as shown in FIG. 6(f), the pressing jig 212 is removed, thereby completing the mounting of the semiconductor chip 207 on the circuit board 211. Subsequently, the same process is repeatedly performed to complete the module.

A description will now be given to the deformation properties of the bump which characterize the present embodiment. A relationship between the strain of the bump 206 and the load is represented by a true-stress-vs.-strain curve represented by the following equation (1):

$$\sigma_t = K \in_n^t \tag{1}$$

Figure 7:
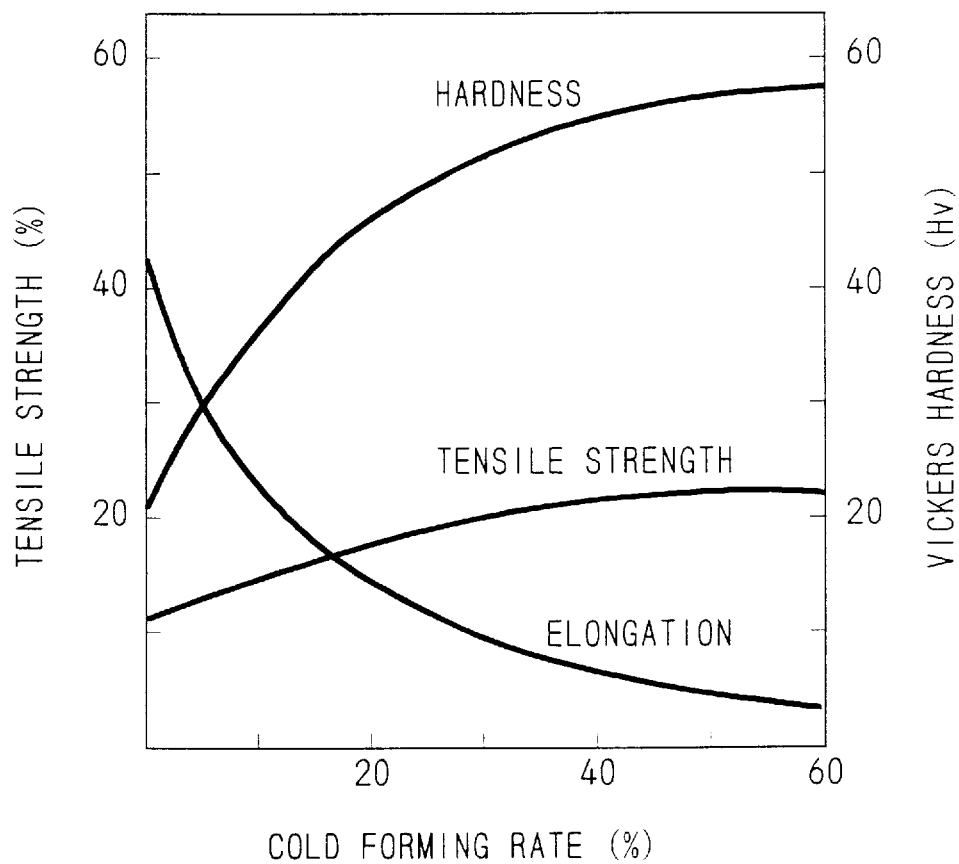
FIG. 7 is a graph showing a relationship between the hardness of Au composing a bump according to the third embodiment and the distortion thereof during cold forming.

(wherein K represents a strength coefficient (or strain hardening coefficient); n represents a work hardening coefficient; $\sigma_t$ represents a true stress; and $\in_t$ represents a true strain). The strength coefficient K is represented by the maximum tensile strength. The work hardening coefficient n is equal to the true strain $\in_t$ under the maximum load. FIG. 7 is a graph showing properties associated with the hardness and strain of Au during cold forming (see "Science of Precious Metals, Applications" edited by Ichiro Tanaka and published by Tanaka Kikinzoku Kogyo Company). The data shows that the maximum tensile strength at a Vickers hardness of 40 Hv is 18 (kg/mm$^2$). Therefore, the strength coefficient is represented as 18 (kg/mm$^2$) and, since the amount of elongation is 20%, the amount of true strain or work hardening coefficient is calculated to be 0.182 in accordance with the following equation (2):

$$\in_t = \ln(I + \in) \tag{2}$$

Hence, the true-stress-vs.-true-strain curve when the Vickers hardness of Au is 40 Hv is represented by the following equation (3):

$$\sigma_t = 18 \in_t^{0.182} \tag{3}$$

If the original height of the bump 206 is assumed to be $I_0$, the height of the bump 206 after pressing is represented by the following equation (4). If the original bottom area of the bump 206 prior to pressing is assumed to be $A_0$, the bottom area A of the bump 206 after pressing is represented by the following equation (5). The compressive stress σ initially applied to the bump 206 is represented by the following equation (6).

$$I = I_0 (1 - \in_t) \tag{4}$$

$$A = A_0 \{1/(1 - \in_t)\} \tag{5}$$

$$\sigma = \sigma_t / (1 - \in_t) \tag{6}$$

Figure 8:
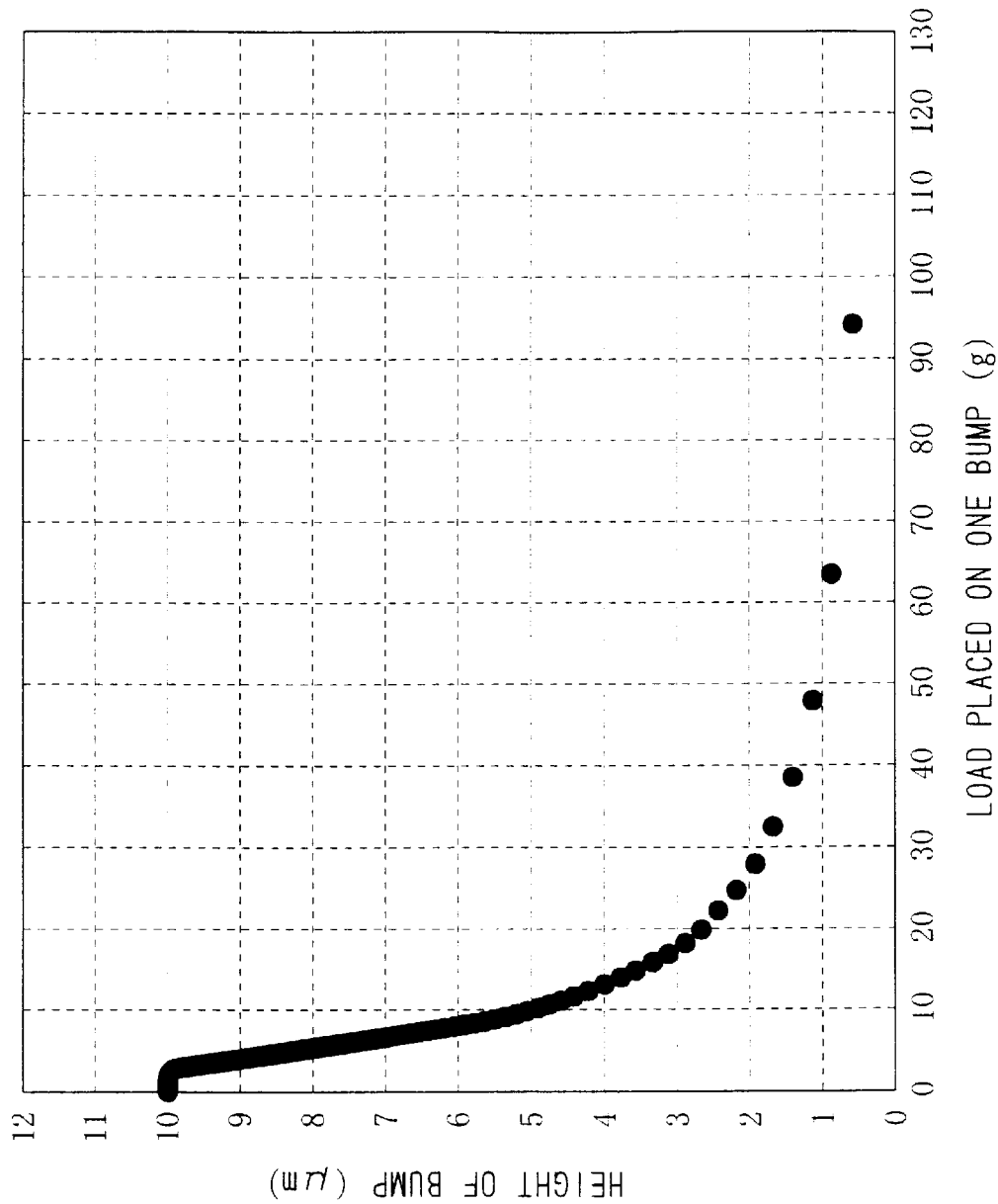
FIG. 8 is a graph showing a relationship between a load placed on one bump and a variation in the height of the bump in the third embodiment.

FIG. 8 is a graph showing a relationship between a load placed on one bump having a height of 10 μm, a diameter of 20 μm, and a hardness of 40 Hv and a variation in the height of the bump. To deform the bump 206 till it has a height of 1.8 μm, a load of 32 (g/bump) is required. At that time, the radius of the bump 206 is calculated to be 24.5 μm in accordance with the equation (5). From the properties shown in FIG. 8, it can be judged that the bump 206 will not be deformed by 1 μm or more even when the load placed thereon is further increased and the deviation from the desired electric properties indicates that the deformation of the bump 206 is substantially saturated.

On the other hand, the Young's modulus of the BCB film composing the dielectric film 203 is 2.6 (GPa) and the strain $\in$ of the BCB film caused by the load is represented by the following equation (7).

$$\in = F/ES \tag{7}$$

(wherein $\in$ represents the strain; F represents the load; E represents the Young's modulus; and S represents an area under pressure). Since the deformation of the dielectric film 203 is concurrent with the deformation of the bump 206, the area S under pressure of the dielectric film 203 varies in accordance with the equation (5) prior to pressing.

Figure 9:
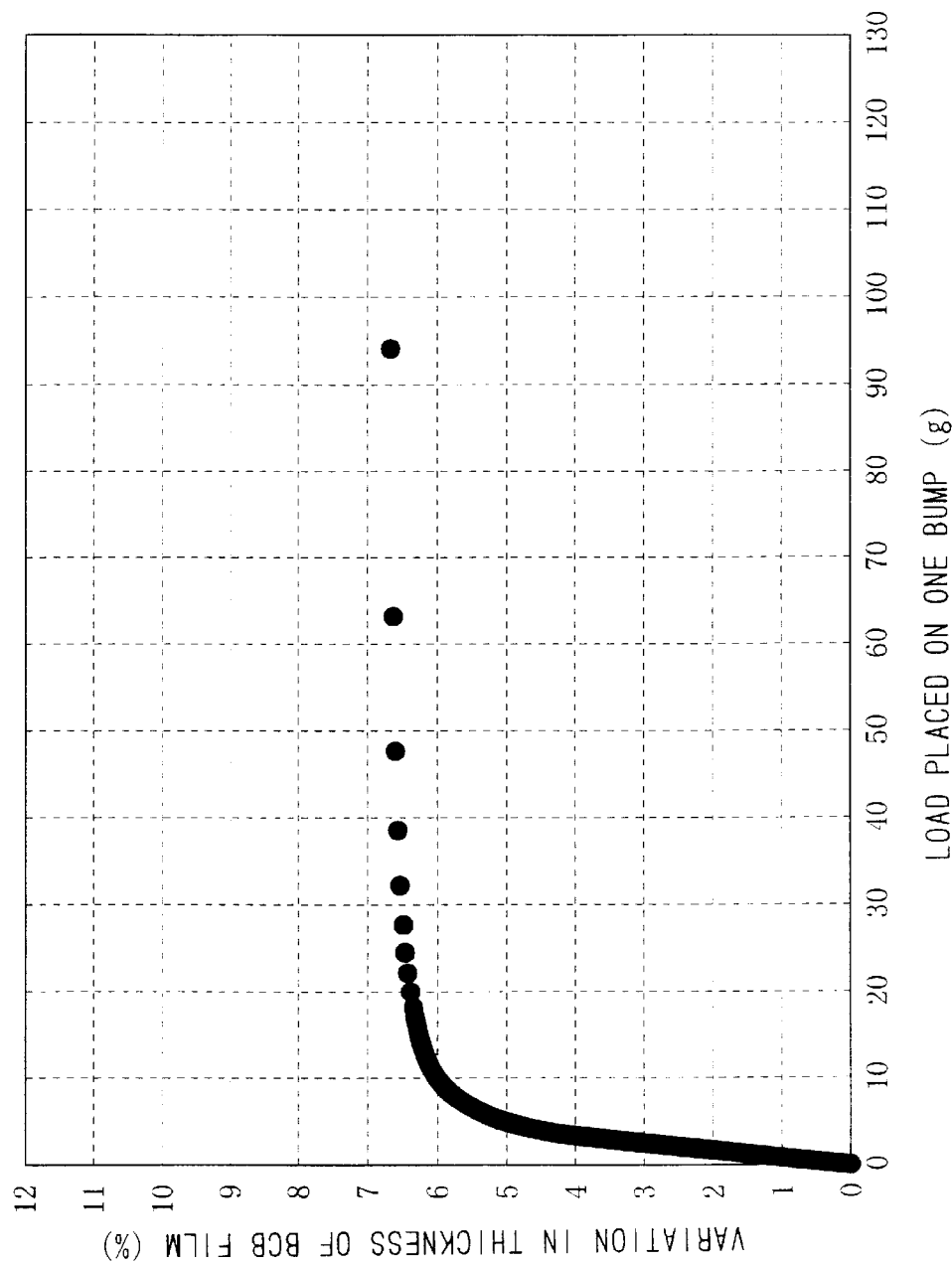
FIG. 9 is a graph showing a relationship between the load placed on one bump and a variation in the thickness of a dielectric film composed of a BCB film in the third embodiment.

FIG. 9 is a graph showing a relationship between the load placed on one bump 206 having a height of 10 μm, a diameter of 20 μm, and a hardness of 40 Hv and the deformation rate of the BCB film composing the dielectric film 203. It can be understood from the graph that the variation in the thickness of the BCB film is substantially constant under 7%. When the variation in the thickness of the BCB film is 10% or less, a reduced influence is exerted on the characteristic impedance.

In the structure in which a plurality of semiconductor chips 7 are mounted by face-down bonding on the wiring board 211 constituted by the conductive film, the dielectric film 203 composed of an organic resin containing BCB or the like and formed on the conductive film, and the interconnecting conductive film 204 formed on the dielectric film 203, the bumps 206 or electrode pads 205 on the wiring board 211 are designed so that the amount of plastic deformation thereof becomes larger than the amount of elastic deformation of the dielectric film 203. Specifically, by adjusting the variation in the thickness of the dielectric film 203 to be 10% or less with the bumps 206 or electrode pads 205 plastically deformed till the deformation thereof caused by compression is saturated as described above, it becomes possible to easily form an insulating film with a relatively large thickness of 20 μm to 30 μm and to form a line having a large width and a characteristic impedance of 50Ω. Although the height of the bump 206 becomes constant at a minimum value at which the bump 206 is compressed to saturation, the variation in the thickness of the dielectric film 203 underlying the interconnecting conductive film 204 under the bump 206 can be limited to 10% or less so that it becomes possible to reduce the impedance of the interconnecting conductive film under the bump and its vicinity. Hence, there can be implemented a structure having properties that can precisely be controlled at low cost in an rf module operating at a radio frequency, which prevents misoperation resulting from impedance dismatching. In particular, the rf module having the foregoing excellent performance can easily be implemented by the manufacturing method illustrated in FIGS. 6(a) to 6(f).

Although the electrode pad 205 and the bump 206 have been compressively deformed till the amount of deformation thereof is saturated in the present embodiment, any one of the electrode pad 205, electrode pad 208, and bump 206 may be compressively deformed to saturation, while the variation in the thickness of the dielectric film 203 is limited to 10% or less.

Although the semiconductor chip 207 has been fixed by using the light setting insulation resin 209, the semiconductor chip 207 may be fixed instead with the application of heat and pressure.

The electrode pads 205 and 208 may be formed from Au, similarly to the bump 206.

The wiring board 211 may be composed of a conductive substrate or an insulating substrate formed with a conductive layer formed on the main side thereof and a dielectric film formed thereon.

The thin film before the interconnecting conductive film 204 is formed may be formed on the dielectric film 203 from a material identical with or different from the conductive material composing the ground conductive film 202.

(Fourth Embodiment)

Figure 10:
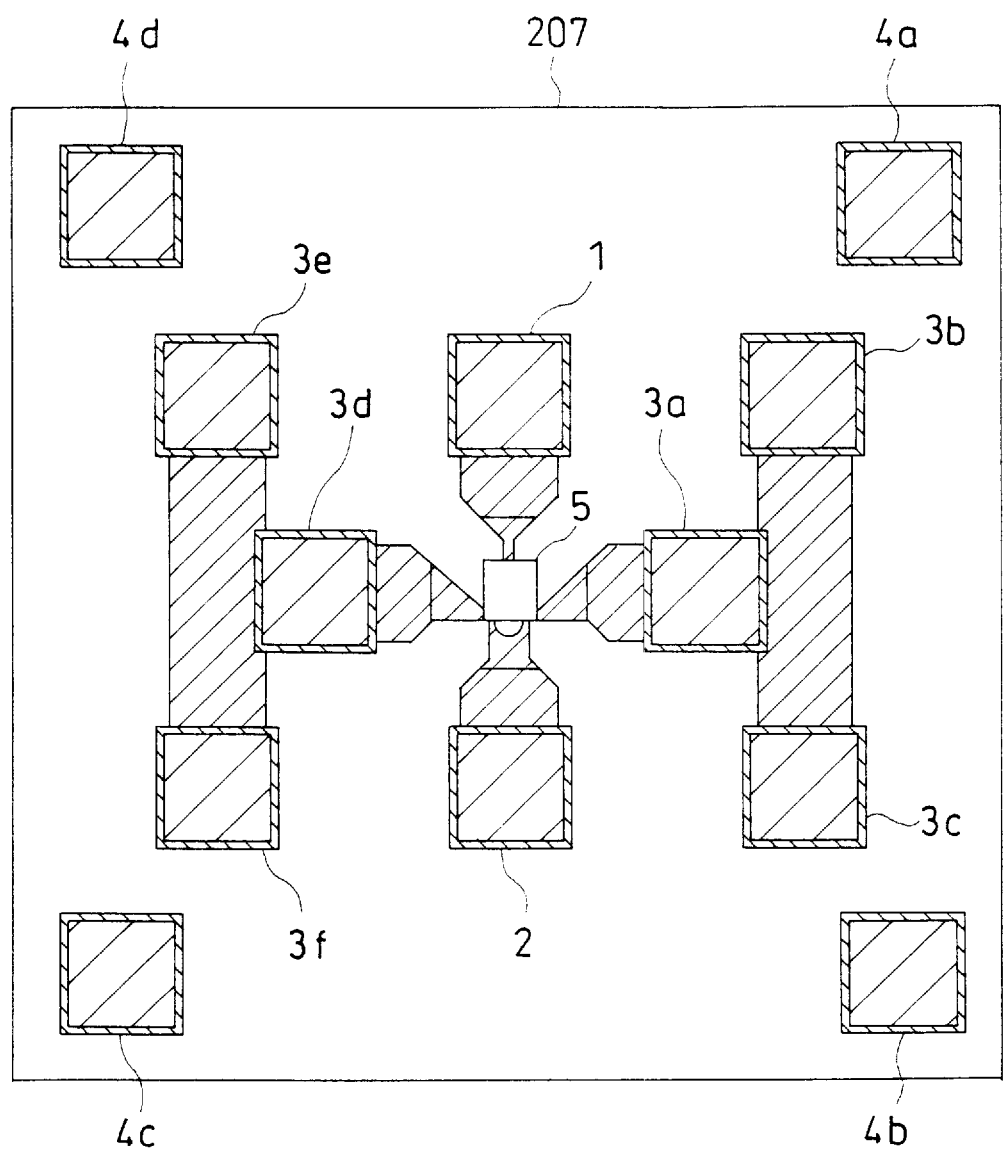
FIG. 10 is a plan view of a semiconductor chip in a fourth embodiment.
Figure 11A:
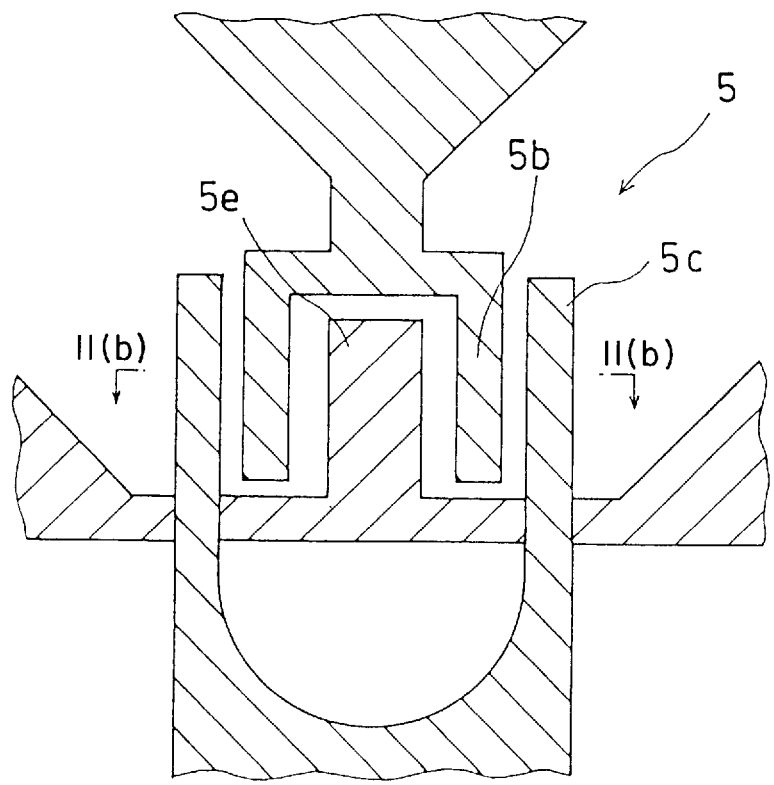
FIG. 11(a) is an enlarged plan view of a portion of a bipolar transistor in the fourth embodiment and FIG. 11(b) is a cross-sectional view taken along the line I—I of FIG. 11(a)
Figure 11B:
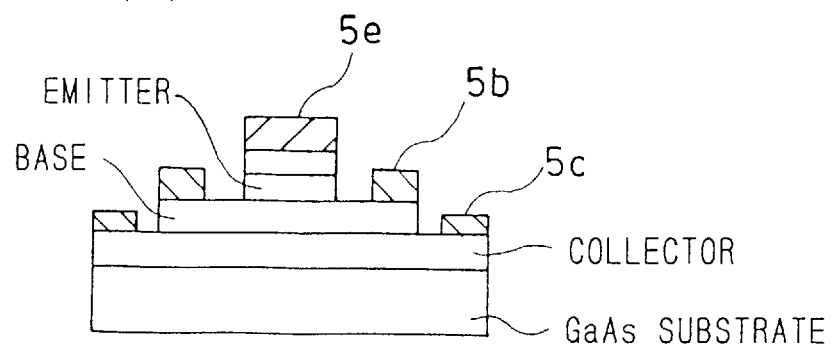

FIG. 10 is a wiring diagram of a bipolar transistor in a semiconductor chip according to a fourth embodiment. FIG. 11(a) is an enlarged plan view showing only the structure of the bipolar transistor in FIG. 10. FIG. 11(b) is a cross-sectional view taken along the line I—I of FIG. 11(a).

As shown in FIGS. 10, 11(a), and 11(b), a semiconductor chip 207 of the same structure as that of the semiconductor chip 207 used in the above third embodiment is provided with pads connected to the respective terminals of a bipolar transistor 5 embedded therein. The pads include a base pad 1 connected to the base terminal 5b of the bipolar transistor, a collector pad 2 connected to the collector terminal 5b thereof, and emitter pads 3a to 3f connected to the emitter terminal 5e thereof.

The present embodiment is characterized by four dummy pads 4a to 4d provided at four corners of the semiconductor chip 207 and unconnected to any of the terminals of the bipolar transistor 5. In principle, three pads are sufficient to provide electrical connection between a bipolar transistor and the substrate, since the bipolar transistor has three terminals at the emitter, base, and drain thereof. In the present embodiment, however, the total of twelve pads including the six emitter pads 3a to 3f and the four dummy pads 4a to 4d are provided. By thus increasing the number of pads including the additional dummy pads 4a to 4d, the load placed on one bump can be reduced, so that each bump is pressed under a load smaller than a minimum load that can be placed by the pressing apparatus. In mounting the semiconductor chip 207, therefore, a bump 208 can be compressively deformed before the dielectric film 203 is deformed, which suppresses the deformation of the dielectric film 203. By adjusting the number of bumps with the addition of the dummy pads 4a to 4f, a proper load which does not deform the dielectric film can be placed. In contrast to the above third embodiment in which the dummy pad is formed on the interconnecting conductive film 204, the dummy pads are formed on the semiconductor chip in the present embodiment. The arrangement also achieves the effect of suppressing the deformation of the dielectric film, similarly to the arrangement according to the third embodiment.

Although the six emitter pads 3a to 3f are provided in the present embodiment on the assumption that the emitter is grounded, the emitter pads 3a to 3f also promise the effect of reducing the inductance of the emitter.

The dummy pads 4a to 4b unconnected to any terminal are preferably provided on the periphery of the semiconductor chip 207 so as not to affect signal interconnects. More preferably, the dummy pads 4a to 4b are effectively disposed at four corners of the semiconductor chip 207 in terms of stably placing the load.

The pads are preferably arranged as symmetrically as possible so that the load is evenly placed on the bumps and the density of the pads is preferably equal. Additional pads may be provided on the side of the substrate opposed to the electrode pads of the semiconductor chip 207 so that bumps are formed on the respective electrode pads of the semiconductor chip. In this case, the pads on the substrate corresponding to the dummy pads 4a to 4d of the semiconductor chip 207 are preferably unconnected to any particular element or grounded.

(Fifth Embodiment)

A fifth embodiment relates to a method of suppressing the deformation of the dielectric film by partially improving the conventional MBB process illustrated in FIGS. 33(a) to 33(e).

Figure 12:
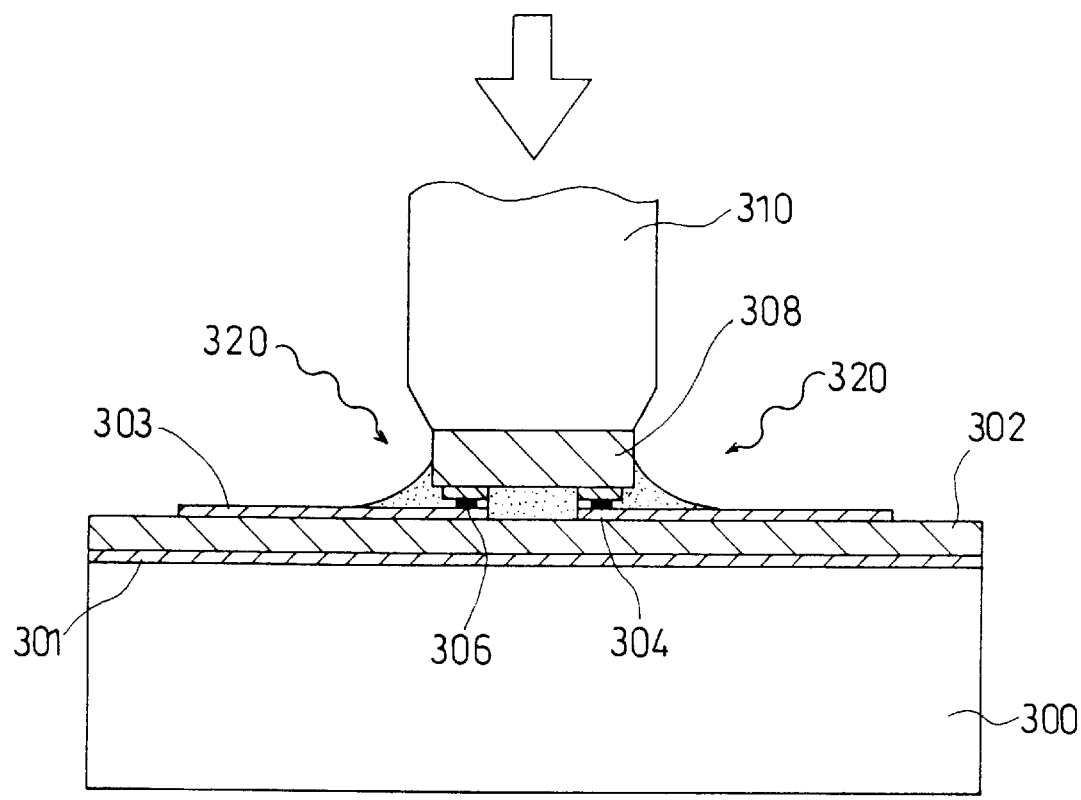
FIG. 12 is a cross-sectional view of a bump immediately before a pressure is applied thereto during the process of implementing an MFIC in a fifth embodiment.
Figure 33A:
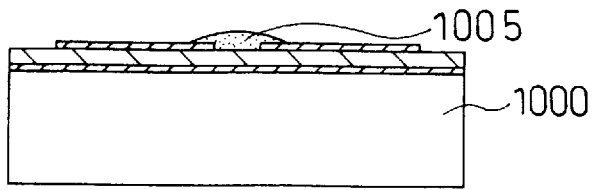
FIGS. 33(a) to 33(e) are cross-sectional views illustrating a process in accordance with a conventional MBB method.
Figure 33B:
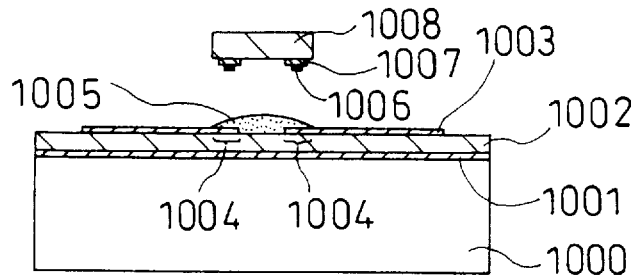
Figure 33C:
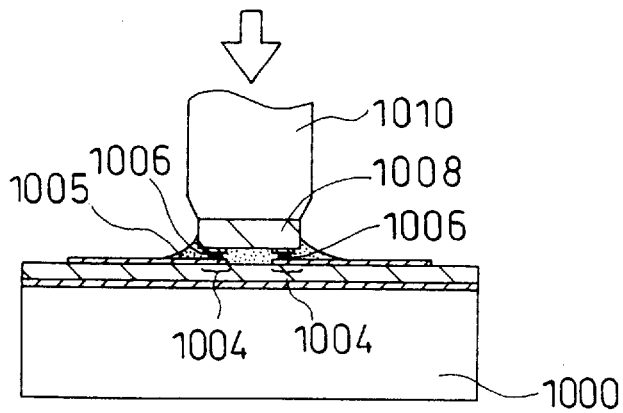
Figure 33D:
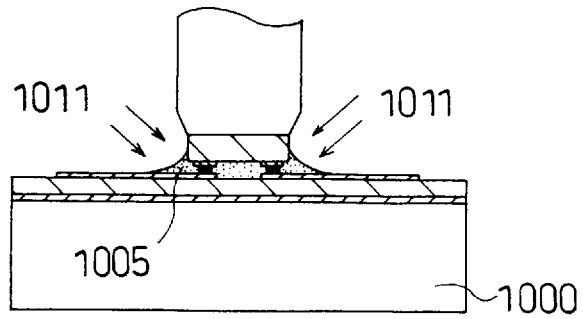
Figure 33E:
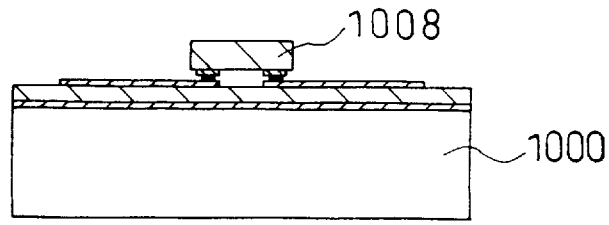

FIG. 12 is a cross-sectional view partially illustrating the process of implementing a semiconductor device according to the fifth embodiment, which corresponds to the step of the conventional MBB process illustrated in FIG. 33(c). Namely, FIG. 12 is an enlarged view of the vicinity of one connecting portion between a semiconductor chip 308 and a substrate 300 immediately before pressing is conducted by the MBB method. In the drawing are shown: the substrate 300 composed of Si or the like; a ground conductive film 301 composed of Au and formed on the main side of the substrate 300; a dielectric film 302 composed of $SiO_2$; and an interconnecting conductive film 303 composed of a conductive material deposited and patterned on the dielectric film 302. The interconnecting conductive film 303, the ground conductive film 301, and the dielectric film 302 constitute a microstrip line. The interconnecting conductive film 303 includes electrode pads 304. Electrode pads 307 are provided on portions of a semiconductor chip 308 with an embedded rf transistor composed of a compound semiconductor or the like. The electrode pads 307 are electrically connected to the electrode pads 304 on the interconnecting conductive film 303 constituting the above microstrip line via bumps 306. A light setting insulation resin 305 is used to fix the semiconductor chip 308 on the substrate 300. The connection provided by the bumps 306 is enhanced by the contracting force of the light setting insulation resin 305.

The present embodiment is characterized in that, in pressing the semiconductor chip 308 by means of a pressing jig 310, an electromagnetic wave 320 is applied substantially only to the bumps 306 to increase the temperature thereof and melt or soften the bumps 306. Alternatively, an ultrasonic wave may be applied to the space between the pressing jig 310 and a holder (not shown) of the substrate 300 to increase the temperature of the bumps.

In the present embodiment, the addition of the step of softening the bumps 306 facilitates the deformation of the bumps being pressed, so that it becomes possible to mount the semiconductor chip without significantly deforming the dielectric film 302. It is to be noted that the steps of the manufacturing process of the present embodiment other than one illustrated in FIG. 12 are the same as those of the conventional process illustrated in FIGS. 33(*a*) to 33(*e*).

(Sixth Embodiment)

A sixth embodiment relates to a method of suppressing the deformation of a dielectric film on the substrate side by improving the structure of an electrode pad of a semiconductor chip to be mounted.

Figure 13:
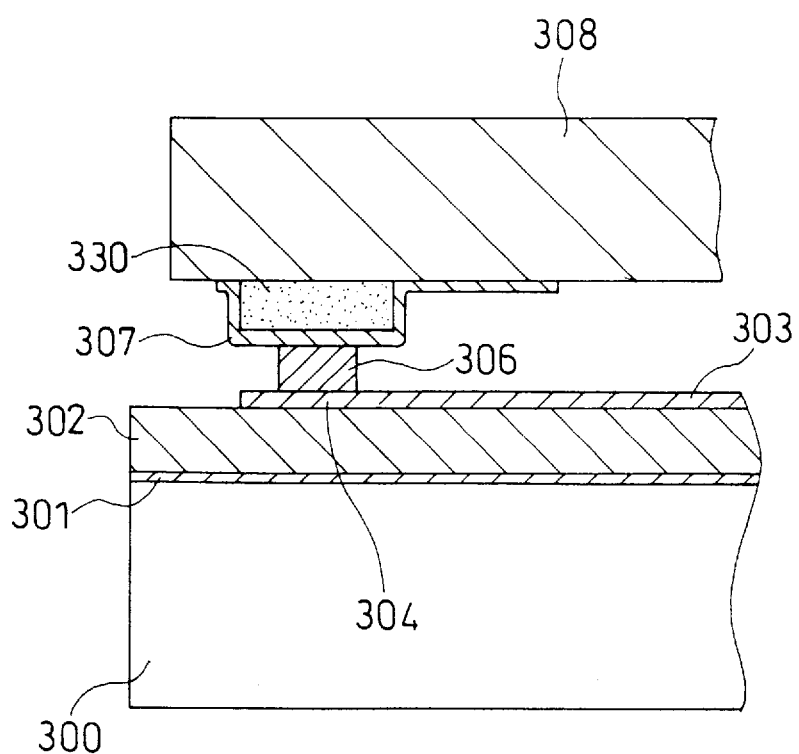
FIG. 13 is a cross-sectional view of a bump immediately before a pressure is applied thereto during the process of implementing an MFIC in a sixth embodiment.

FIG. 13 is a cross-sectional view partially illustrating the process of implementing a semiconductor device according to the sixth embodiment, which corresponds to the step of the conventional MBB process illustrated in FIG. 33(*c*). Namely, FIG. 13 is an enlarged view of the vicinity of one connecting portion between a semiconductor chip 308 and a substrate 300 immediately before pressing is conducted by the MBB method. In FIG. 13, like reference numerals used in FIG. 12 showing the fifth embodiment designate like components so that the description thereof is omitted in the present embodiment.

The present embodiment is characterized in that a buffer film 330 having a smaller Young's modulus (or softer) than a dielectric film 302 on the substrate is provided as the underlie of electrode pads 307 of the semiconductor chip 308. As a result, the buffer film 330 is elastically deformed preferentially in pressing the semiconductor chip 308 so that the deformation of the dielectric film 302 on the substrate 300 is prevented. Although the buffer film 330 is composed of an organic insulating film such as a polyimide film, any film may be used as long as it has a smaller Young's modulus than the dielectric film 302 (composed of a BCB film in the present embodiment) on the substrate 300 and is easily deformed.

(Seventh Embodiment)

A seventh embodiment relates to a method of suppressing the deformation of a dielectric film on the substrate by improving the structure of a bump prior to mounting.

Figure 14:
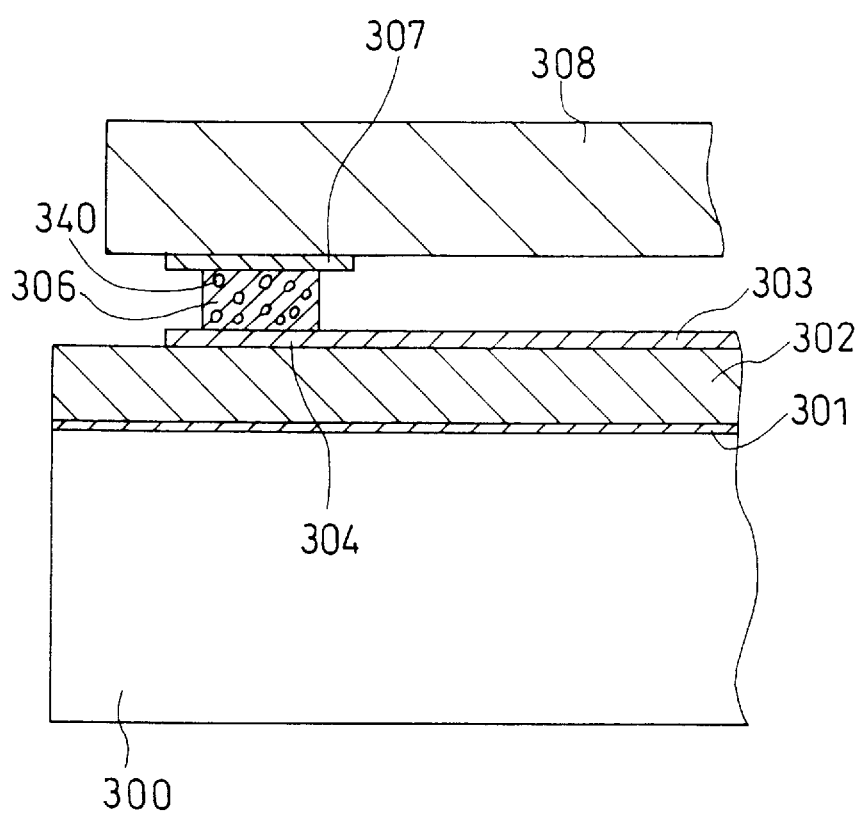
FIG. 14 is a cross-sectional view of a bump immediately before a pressure is applied thereto during the process of implementing an MFIC in a seventh embodiment.

FIG. 14 partially illustrates the process of implementing a semiconductor device according to the seventh embodiment, which is an enlarged view of the vicinity of one connecting portion between a semiconductor chip 308 and a substrate 300 immediately before pressing is conducted by the MBB method. In FIG. 14, like reference numerals used in FIG. 12 showing the fifth embodiment designate like components so that the description thereof is omitted here.

The present embodiment is characterized in that a bump 306 contains numerous voids 340. In pressing the semiconductor chip 308, the voids 340 easily collapse to deform the bumps so that MBB mounting is implemented without deforming the dielectric film 302 of the substrate 300. To fabricate the bump containing such numerous voids 340, a mixture of an organic solvent and metal powder is formed into a bump, followed by the evaporation of the solvent. Instead of the voids 340, a large number of grooves may be formed or a porous bump having indiscrete holes may be used.

(Eighth Embodiment)

An eighth embodiment relates to a method of suppressing the deformation of a dielectric film on the substrate by improving the structure of a dielectric film and an interconnecting conductive film on the substrate prior to mounting.

Figure 15:
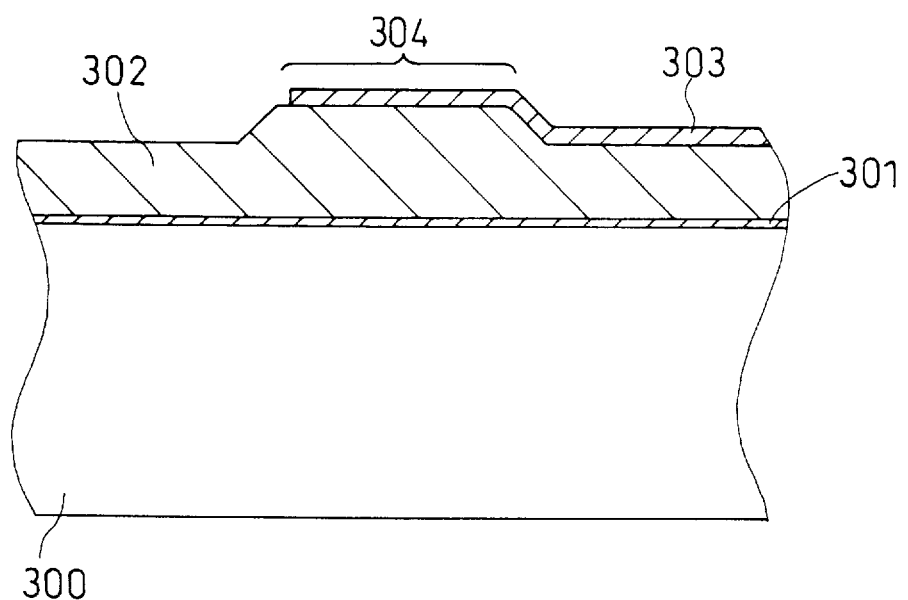
FIG. 15 is a cross-sectional view partially showing a substrate of an MFIC in an eighth embodiment.

FIG. 15 is a cross-sectional view partially showing a substrate 300 of an MFIC prior to mounting according to the eighth embodiment.

The present embodiment is the same as each of the foregoing embodiments in the structure of a wiring board in which a ground conductive film 301, a dielectric film 302 composed of a BCB film, and an interconnecting conductive film 303 composed of Au or the like are provided on the substrate 300 composed of Si or the like. In the present embodiment, however, these portions of the dielectric film 302 underlying electrode pads 304 of the interconnecting conducive film 303 are preliminarily formed to be thicker than the other portion of the interconnecting conductive film 303 so that the electrode pads 304 are positioned higher in level than the other portion of the interconnecting conductive film 303 in consideration of a reduction in the thickness of the dielectric film 302 accompanying the deformation thereof under pressure in mounting the chip. After the dielectric film 302 is deformed under pressure during mounting, therefore, the thickness of the portions of the dielectric film 302 underlying the electrode pads 304 becomes substantially equal to the thickness of the other portion, thereby reducing fluctuations of the impedance. To easily form the dielectric film 302 in such a configuration, the dielectric film 302 is previously formed thick so that the portion of the dielectric film 302 other than the portions thereof underlying the electrode pads 304 is selectively removed by etching.

(Ninth Embodiment)

A ninth embodiment relates to a method of suppressing the deformation of the portions of a dielectric film corresponding to electrode pads by applying a pressure to the portion of the dielectric film not corresponding to the electrode pads.

Figure 16:
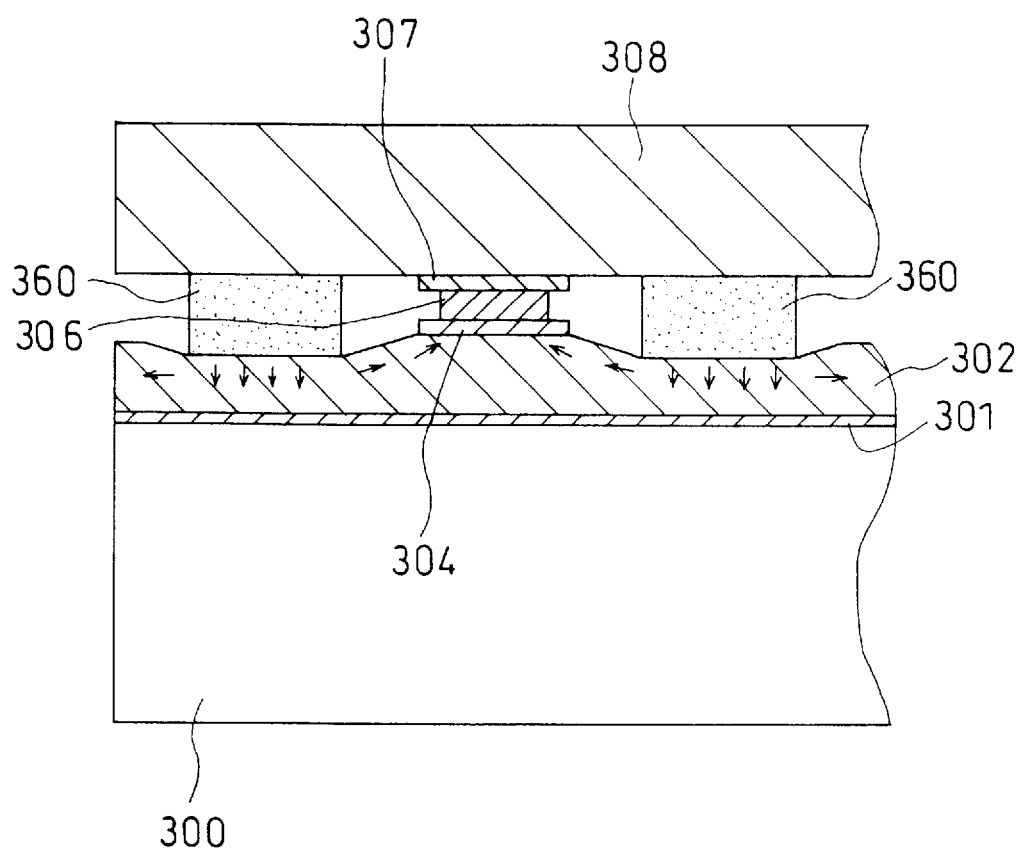
FIG. 16 is a cross-sectional view of a bump to which a pressure is being applied during the process of implementing an MFIC in a ninth embodiment.

FIG. 16 partially illustrates the process of implementing a semiconductor device according to the ninth embodiment, which is an enlarged view of the vicinity of one connecting portion between a semiconductor chip 308 and a substrate 300 immediately before pressing is conducted by the MBB method. In FIG. 16, like reference numerals used in FIG. 12 showing the fifth embodiment designate like components so that the description thereof is omitted here.

The present embodiment is characterized in that support columns 360 are provided on both sides of an electrode pad 304 of the semiconductor chip 308. The height of the support columns 360 is larger than the total height of an electrode pad 307, a bump 306, and the electrode pad 304. The support columns 360 are composed of a material much harder than a dielectric film 302 on the substrate 300. During pressing, the support columns 360 preferentially push down and deform the dielectric film 302 so that a force to push up the electrode pad 304 is produced in the portion of the dielectric film 302 corresponding to the space between the two support columns 360. The balance achieved between the force to push up the electrode pad 304 and the pressure exerted by the bump 305 deformation e deformation of the dielectric film 302. Although the thickness of the dielectric film 302 is reduced under the support columns 360, there should be no problem if no interconnecting conductive film is provided at the portions with which the support columns 360 are brought in contact.

(Tenth Embodiment)

A tenth embodiment relates to a method of suppressing the deformation of a dielectric film by improving the structure of an electrode pad.

Figure 17:
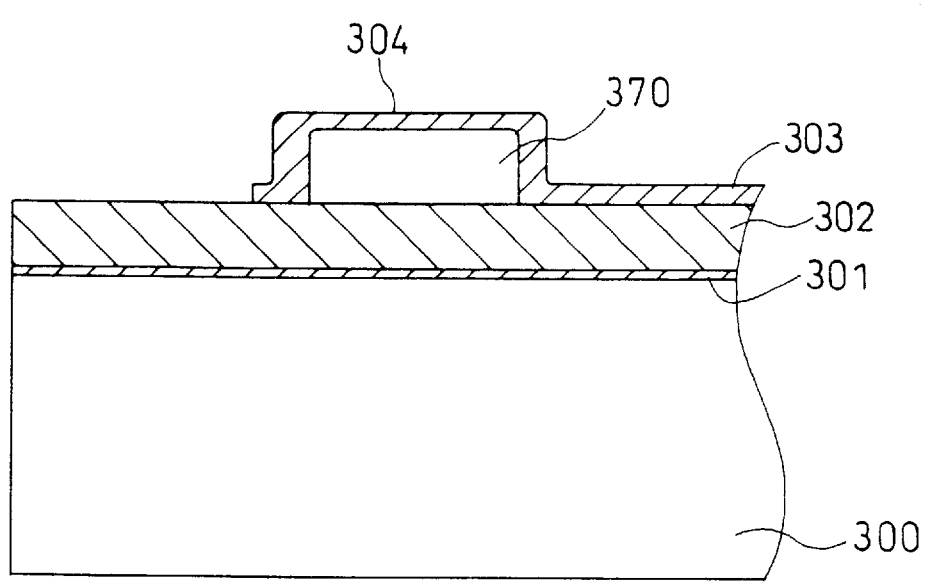
FIG. 17 is a cross-sectional view partially showing the substrate of an MFIC in a tenth embodiment.

FIG. 17 partially illustrate the process of implementing a semiconductor device according to the tenth embodiment, which is an enlarged view of the vicinity of one connecting portion between a semiconductor chip 308 and a substrate 300 immediately before pressing is conducted by the MBB method. In FIG. 17, like reference numerals used in FIG. 12 showing the fifth embodiment designate like components so that the description thereof is omitted here.

According to the present embodiment, a hollow portion 370 is formed under an electrode pad 304 by air-bridge technology. The hollow portion 270 preliminarily formed in an air-bridge portion easily collapses during pressing, thereby suppressing the deformation of the dielectric film 302.

Alternatively, if the electrode pad of the semiconductor chip is formed to have an air-bridge structure, a similar effect can be achieved.

(Eleventh Embodiment)

An eleventh embodiment relates to an MFIC using a film composed of benzocyclobutene (hereinafter referred to as BCB) having a dielectric constant and a dielectric loss tangent each smaller than those of a silicon dioxide film for an interlayer insulating film.

In FIG. 18 are shown: a substrate 501 composed of glass or Si; a ground conductive film 502 composed of a Ti/Au/Ti multilayer film formed on the substrate 501; a BCB film 504 formed on the ground conductive film 502; and a first interconnecting conductive film 506 composed of a Ti/Au/Ti multilayer film formed on the BCB film 504. The first interconnecting conductive film 506 partially serves as a lower electrode of a capacitor. A contact hole 507 is for connecting the first interconnecting conductive film 506 to the ground conductive film 502. An interlayer insulating film 508 serves as a capacitive portion of the capacitor. A second interconnecting conductive film 509 is composed of a Ti/Au/Ti multilayer film and partially serves as an upper electrode of the capacitor. The ground conductive film 502, the BCB film 504, and the interconnecting conductive film 506 or 509 constitute a microstrip line. A semiconductor chip 511 is formed with a transistor which is a hetero-junction field-effect transistor for radio frequencies having a cut-off frequency of 120 MHz for use with a quasi-millimeter wave and a millimeter wave. Signal interconnects 512 are provided on the semiconductor chip 511. Bumps 513 are used to connect the interconnecting conductive film 506 or 509 on the substrate 501 to the signal interconnects 512 on the semiconductor chip 511. The semiconductor chip 511 is connected by flip-chip bonding to the microstrip line on the substrate 501 via the bumps 513 so as to form the MFIC.

Below, a description will be given to the process of manufacturing the MFIC of the present embodiment.

Figure 18A:
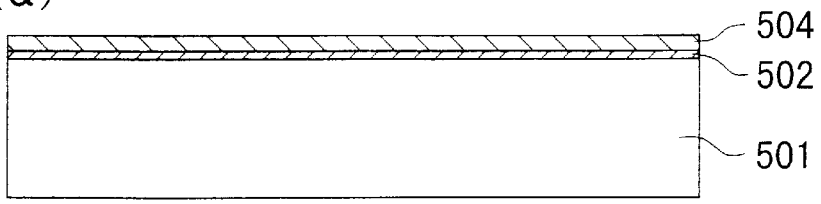
FIGS. 18(a) to 18(e) are cross-sectional views illustrating the process of manufacturing an MFIC according to an eleventh embodiment.

First, as shown in FIG. 18(a), the Ti/Au/Ti multilayer film is formed as the ground conductive film 502 on the substrate 501 so that the individual layers have thicknesses of about 50 nm, 1000 nm, and 50 nm, respectively. On the ground conductive film 502, there is formed the BCB film 504 having a thickness of about 10 $\mu$m.

Figure 18B:
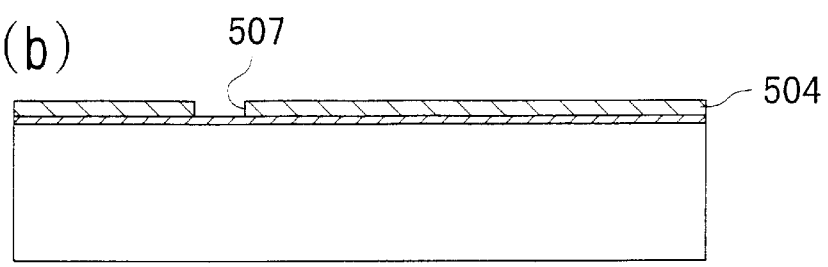

Next, as shown in FIG. 18(b), the contact hole 507 for connection to the ground conductive film 502 is formed in a desired portion of the BCB film 504.

Figure 18C:
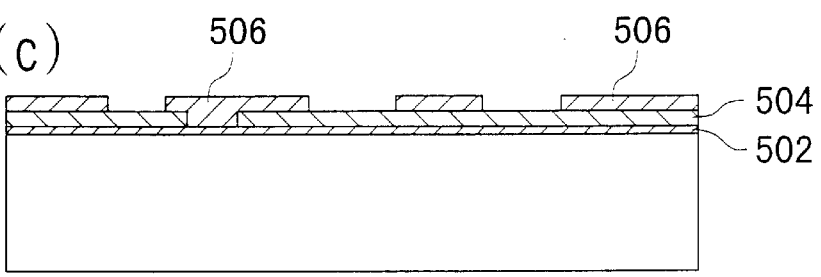

Then, as shown in FIG. 18(c), the Ti/Au/Ti multilayer film is formed as the first interconnecting conductive film 506 having a desired pattern and serving as the lower electrode of the capacitor. After that, a silicon nitride film is formed as the interlayer insulating film 508 for the MIM capacitor over the entire surface of the substrate.

Figure 18D:
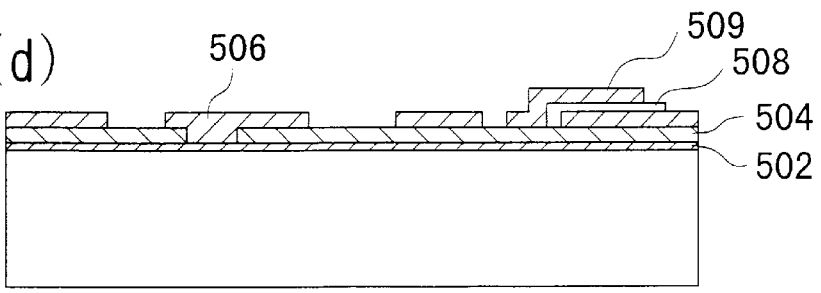

Next, as shown in FIG. 18(d), the above interlayer insulating film 508 is processed into a desired pattern, followed by the deposition of the Ti/Au/Ti multilayer film which is then patterned to form the second interconnecting conductive film 509 partially serving as the upper electrode of the capacitor.

Figure 18E:
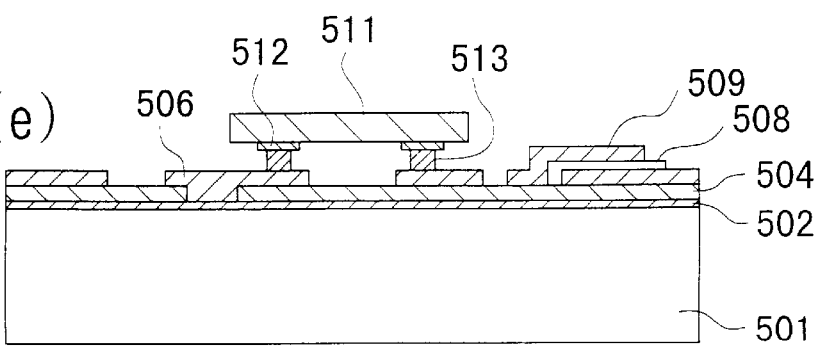

Then, as shown in FIG. 18(e), the bumps 513 each having a height of about 10 $\mu$m are formed on desired portions of the interconnecting conductive film 506 or 509.

Next, as shown in FIG. 18(f), the above bumps 513 are connected to the signal interconnects 512 on the semiconductor chip 511, thereby completing the MFIC.

Thus, by using the BCB film for the dielectric film, an insertion loss in the transmission lines of the MFIC can be reduced.

(Twelfth Embodiment)

If the BCB film having a thickness of about 10 $\mu$m in the eleventh embodiment is intended to have a larger thickness in order to further reduce the insertion loss, the resulting BCB film has degraded adhesion to the ground conductive film even when conditions for the formation of the BCB film are optimized. At worst, the BCB film may peel off the ground conductive film. To overcome the problem, each of the following embodiments will describe a semiconductor device in which the BCB film with an increased thickness exhibits no peeling.

Referring now to FIG. 19 and FIGS. 20(a) to 20(f), a semiconductor device according to a twelfth embodiment and a method of manufacturing the same will be described.

In the drawings are shown: a substrate 501 composed of glass or Si; a ground conductive film 502 composed of a Ti/Au/Ti multilayer film formed on the substrate 501; an insulating thin film 503 composed of a silicon dioxide film formed on the ground conductive film 502; a benzocyclobutene resin film (hereinafter referred to as a BCB film) 504 formed on the insulating thin film 503; and an interconnecting conductive film 506 composed of Au and formed on the BCB film 504. The ground conductive film 502, the insulating thin film 503, the BCB film 504, and the interconnecting conductive film 506 constitute a microstrip line. A contact hole 507 is for connecting the interconnecting conductive film 506 to the ground conductive film 502. A semiconductor chip 511 is formed with an embedded transistor. Signal interconnects 512 are provided on the semiconductor chip 511. Bumps 514 are used to connect the microstrip line on the glass substrate 501 to the signal interconnects 512 on the semiconductor chip 511.

Figure 19:
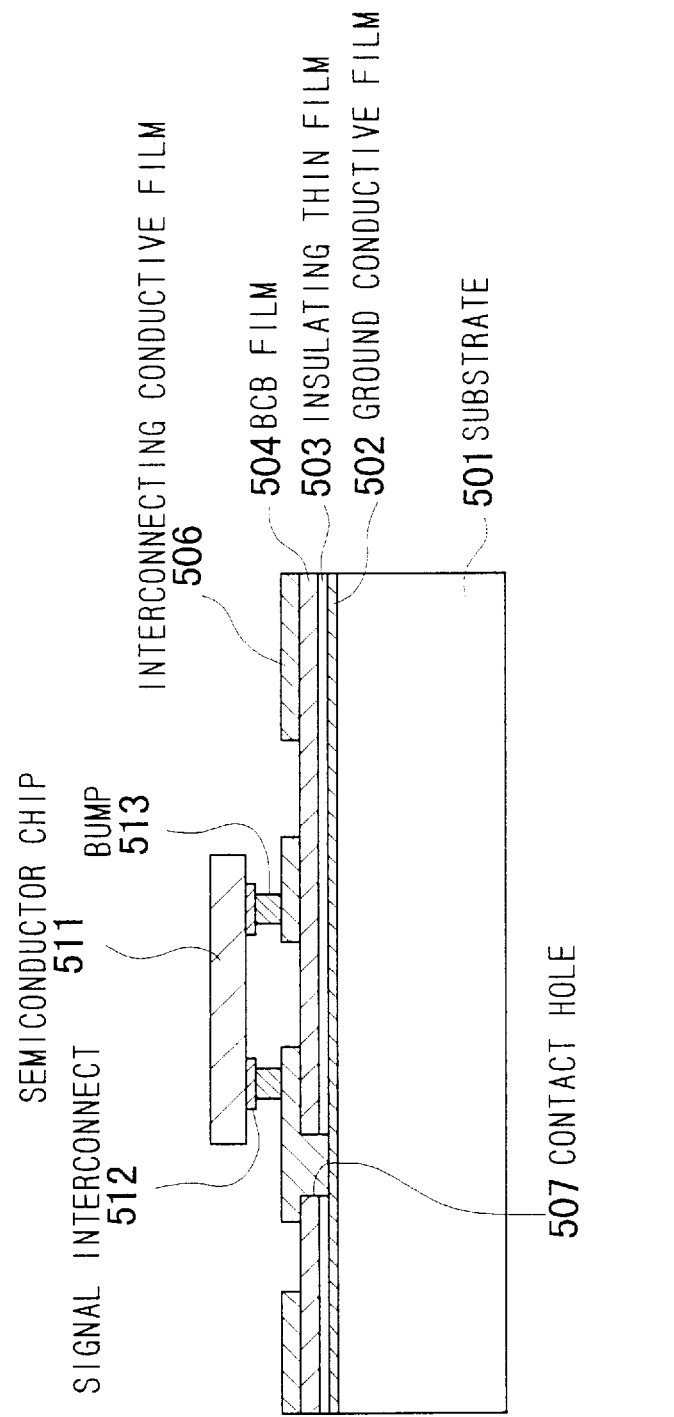
FIG. 19 is a cross-sectional view showing the structure of an MFIC according to a twelfth embodiment.

Below, a description will be given to the manufacturing process for implementing the MFIC shown in FIG. 19.

Figure 20A:
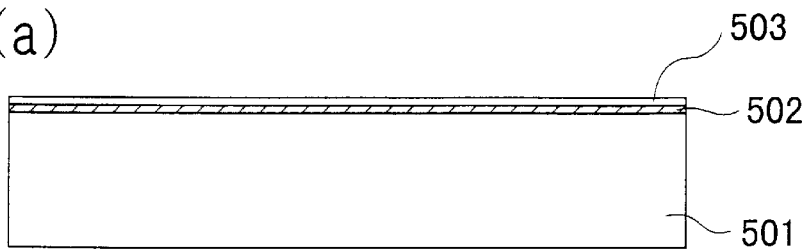
FIGS. 20(a) to 20(d) are cross-sectional views illustrating the process of manufacturing the MFIC according to the twelfth embodiment.

First, as shown in FIG. 20(a), the Ti/Au/Ti multilayer film is formed as the ground conductive film 502 on the substrate 501 so that the individual layers have thicknesses of about 50 nm, 1000 nm, and 50 nm, respectively. On the ground conductive film 502, there is formed a silicon dioxide film having a thickness of about 300 nm as the insulating thin film 503.

Figure 20B:
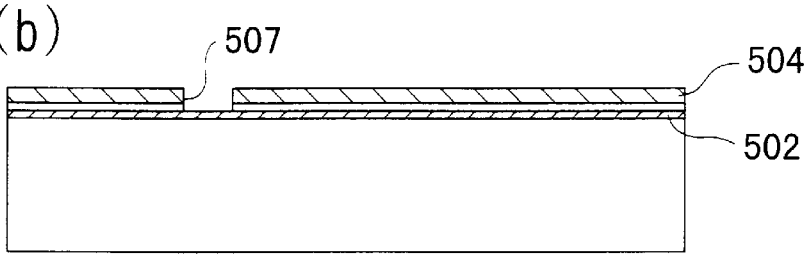

Next, as shown in FIG. 20(b), the BCB film 504 is formed to a thickness of 20 μm, followed by the formation of the contact hole 507 in a desired portion of the BCB film 504 and insulating thin film 503 by dry etching using a $CF_4/O_2$ mixture gas.

Figure 20C:
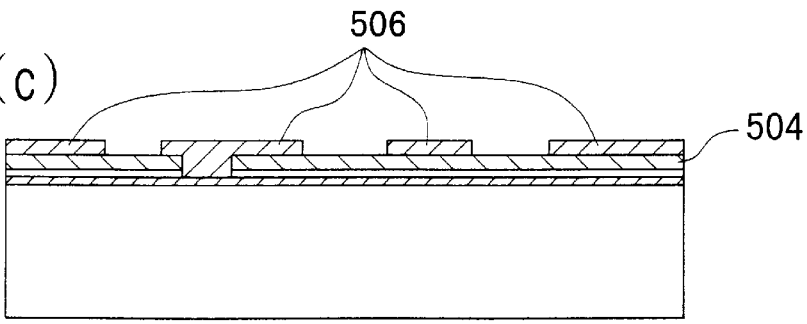

Then, as shown in FIG. 20(c), the interconnecting conductive film 506 having a desired pattern and a thickness of about 2 μm is formed by Au plating in the contact hole 507 and on the BCB film 504.

Figure 20D:
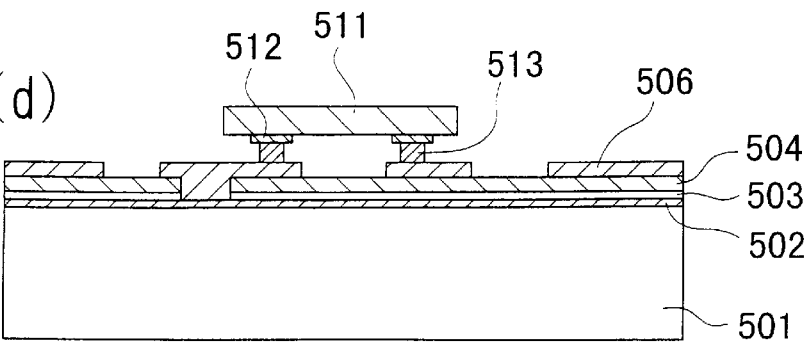

Thereafter, as shown in FIG. 20(d), the bumps 513 are formed by plating on desired portions of the interconnecting conductive film 506. The bumps 513 are then connected by flip-chip bonding to the signal interconnects 512 of the semiconductor chip 511 with the embedded transistor such as a HEMT, thereby completing the MFIC.

According to the present embodiment, the insulating thin film 503 composed of the silicon dioxide film is interposed between the BCB film 504 and the ground conductive film 502 so that the BCB film 504 and the insulating thin film 503 constitute a dielectric film of a microstrip line. The BCB film exhibits excellent adhesion to the silicon dioxide film even when the thickness of the BCB film is about 30 μm. The following is the reason for the excellent adhesion.

Figure 21A:
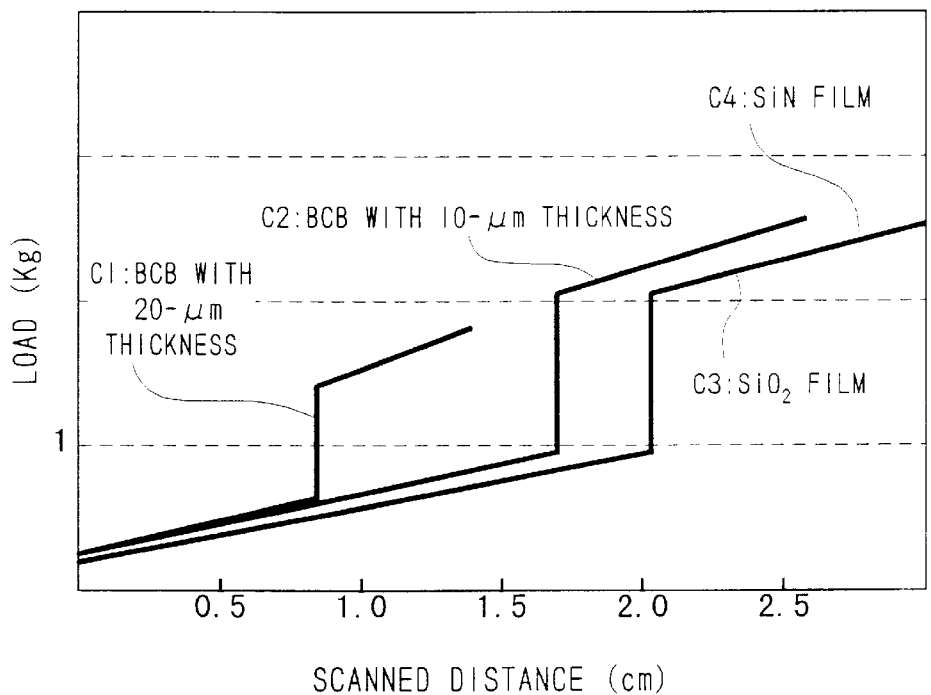
Figure 21A:
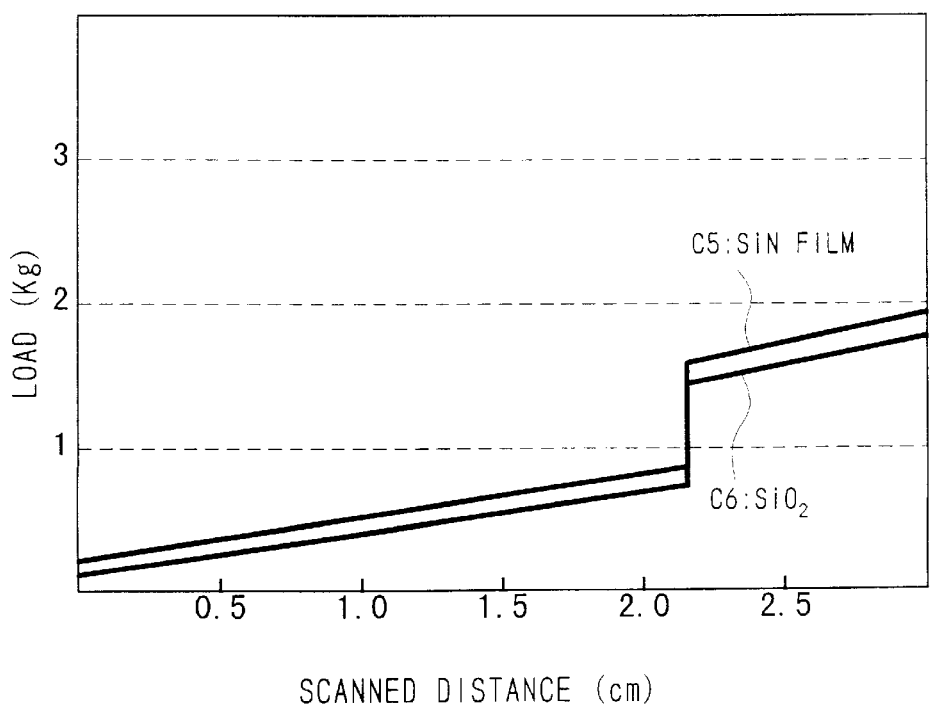
Figure 22:
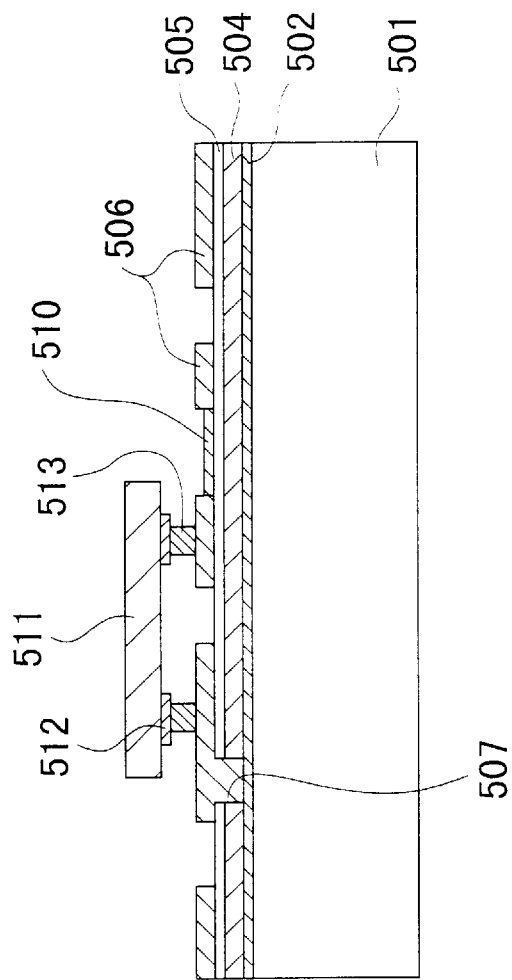
FIG. 22 is a cross-sectional view showing the structure of an MFIC according to a thirteenth embodiment.

FIGS. 21(a) and 21(b) show the results of measuring respective adhesions of films by means of a scratching tester, of which FIG. 21(a) shows the result of measuring respective adhesions of different types of films formed on the ground conductive film as the underlie and FIG. 21(b) shows the result of measuring respective adhesions of different types of films serving as the underlie of the BCB film. In FIG. 21(a), the vertical axis represents a load placed on a stylus of the scratching tester by a peeled film during scanning and the horizontal axis represents a scanned distance travelled by the stylus. In FIGS. 21(a) and 21(b), the characteristic line C1 represents the adhesion of a BCB film having a thickness of 20 μm to the top surface of the ground conductive film 502 or Ti/Au/Ti multilayer film (with a thickness of 1 μm). The characteristic line C2 represents the adhesion of a BCB film having a thickness of 10 μm to the top surface of a Ti/Au/Ti multilayer film. The characteristic line C3 represents the adhesion of a silicon dioxide film (with a thickness of 300 nm) to the top surface of the ground conductive film. The characteristic line C4 represents the adhesion of a silicon nitride film (with a thickness of 300 nm) to the top surface of the ground conductive film. The characteristic line C5 represents the adhesion of a BCB film having a thickness of 20 μm to the top surface of a silicon dioxide film (with a thickness of 300 nm). The characteristic line C6 represents the adhesion of a BCB film having a thickness of 20 μm to the top surface of a silicon nitride film (with a thickness of 300 nm). As can be appreciated from the drawings, the BCB film on the Ti/Au/Ti multilayer film exhibits degraded adhesion thereto. When the thickness of the BCB film is 20 μm, in particular, the adhesion is extremely poor. On the other hand, it can also be appreciated that the silicon dioxide film or silicon nitride film on the ground conductive film and the BCB film on the silicon dioxide film or silicon nitride film exhibit satisfactory adhesion. Hence, the peeling of the BCB film off the ground conductive film can effectively be prevented by interposing the silicon dioxide film or silicon nitride film between the ground conductive film and the BCB film.

The result of evaluation has also proved that a BCB film 504 having a thickness of 10 μm or less exhibits a certain degree of adhesion even when another insulating film such as a silicon dioxide film is not interposed. In this case also, an insulating film such as a silicon dioxide film provided under the BCB film has the advantage of further enhancing the adhesion of the BCB film to the underlie.

In the step of forming the contact hole 507 in the present embodiment, the insulating thin film 503 composed of the silicon dioxide film and the BCB film 504 can be etched using the same gas under the same conditions, so that only one step of etching is sufficient with no increase in the number of process steps.

(Thirteenth Embodiment)

The twelfth embodiment has described the case where the insulating thin film is formed beneath the BCB film. In contrast, a thirteenth embodiment forms an insulating thin film on the BCB film.

In FIG. 22 and FIGS. 23(a) to 23(e) are shown: a substrate 501 composed of glass or Si; a ground conductive film 502 composed of a Ti/Au/Ti multilayer film formed on the substrate 501; a BCB film 504 formed on the ground conductive film 502; an insulating thin film 505 formed on the BCB film 504; and an interconnecting conductive film composed of Au and formed on the insulating thin film 505. The ground conductive film 502, the BCB film 504, the insulating thin film 505, and the interconnecting conductive film 506 constitute a microstrip line. A contact hole 507 is for connecting an interconnecting conductive film 506 to the ground conductive film 502. A thin-film resistor 510 is formed on the insulating thin film 505. A semiconductor chip 511 is formed with an embedded transistor. Signal interconnects 512 are provided on the semiconductor chip 511. Bumps 514 are used to connect the microstrip line on the glass substrate 501 to the signal interconnects 512 on the semiconductor chip 511.

Below, a description will be given to the process of manufacturing an MFIC according to the present embodiment.

Figure 23A:
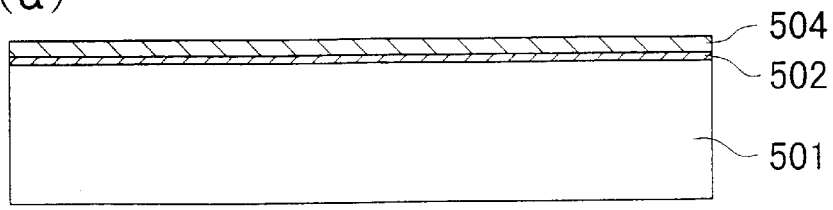
FIGS. 23(a) to 23(e) are cross-sectional views illustrating the process of manufacturing the MFIC according to the thirteenth embodiment.

First, as shown in FIG. 23(a), a Ti/Au/Ti multilayer film is formed as the ground conductive film 502 on the glass substrate 501 so that the individual layers have thicknesses of about 50 nm, 1000 nm, and 50 nm, respectively. On the ground conductive film 502, there is formed the BCB film 504 having a thickness of about 20 μm.

Figure 23B:
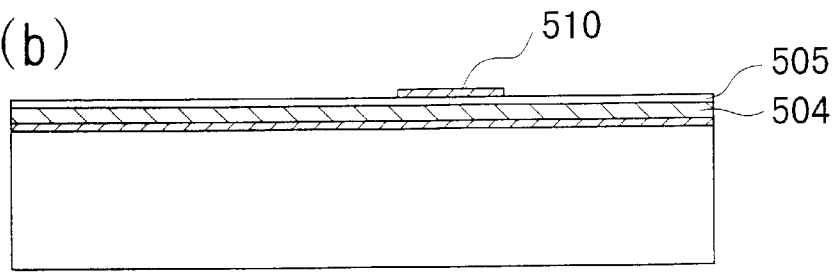

Next, as shown in FIG. 23(b), a silicon nitride film having a thickness of about 300 nm is formed as the insulating thin film 505 over the entire surface of the substrate, followed by the formation of the thin-film resistor 510 composed of a NiCr thin film thereon.

Figure 23C:
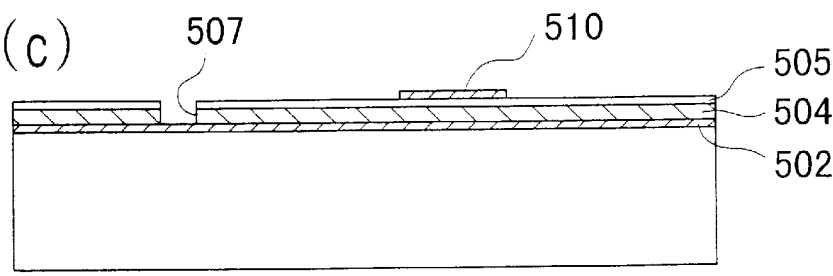

Then, as shown in FIG. 23(c), the insulating thin film 505 and the BCB film 504 are subjected to dry etching using a $CF_4/O_2$ mixture gas so that the contact hole 507 is formed in a desired position.

Figure 23D:
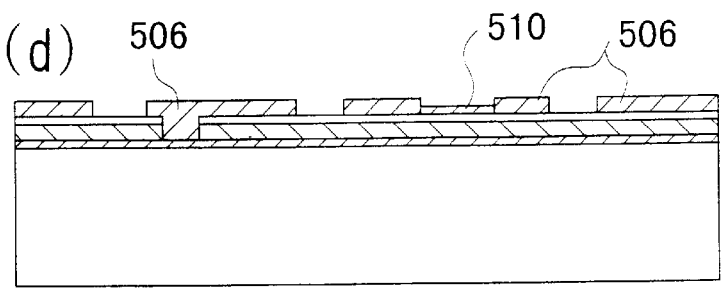

Next, as shown in FIG. 23(d), the interconnecting conductive film 506 having a desired pattern and a thickness of 2 μm is formed by Au plating in the contact hole 507 and on the insulating thin film 505.

Figure 23E:
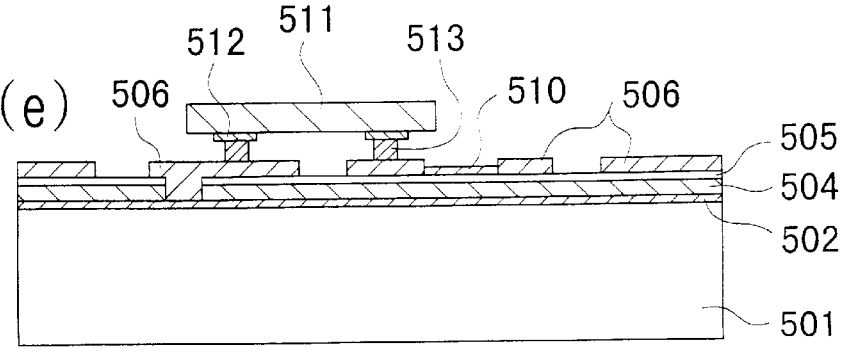

Thereafter, as shown in FIG. 23(e), the bumps 513 are formed by plating on desired portions of the interconnecting conductive film. The bumps 513 are connected to the signal interconnects 512 on the semiconductor chip 511 by flip-chip bonding, thereby completing the MFIC.

According to the present embodiment, the insulating thin film 505 such as a silicon nitride film composing the dielectric film in conjunction with the BCB film 504 has the function of enhancing the adhesion of the NiCr thin film composing the thin-film resistor 510 and the function as a protective film for preventing a heat generated from the NiCr thin film from being transmitted to the BCB film. Since the heat generated from the thin-film resistor 510 is less likely to be transmitted to the BCB film 504, the BCB film 504 exhibits no cracking or thermal deformation resulting from a thermal shock, so that a highly reliable MFIC is implemented.

The insulating thin film 505 functions as a holder for the first or second interconnecting conductive film 506 or 509 in mounting the semiconductor chip 511 by flip-chip bonding. The arrangement prevents the bonding pressure from being transmitted to the inside of the BCB film 504 and absorbed therein so that a proper pressure is exerted on the bumps, resulting in satisfactory bonding.

(Fourteenth Embodiment)

The twelfth and thirteenth embodiments have described the case where the insulating thin film is formed beneath the BCB film and the case where the insulating thin film is formed on the BCB film, respectively. In a fourteenth embodiment, by contrast, insulating thin films are formed on and beneath the BCB film.

Figure 24:
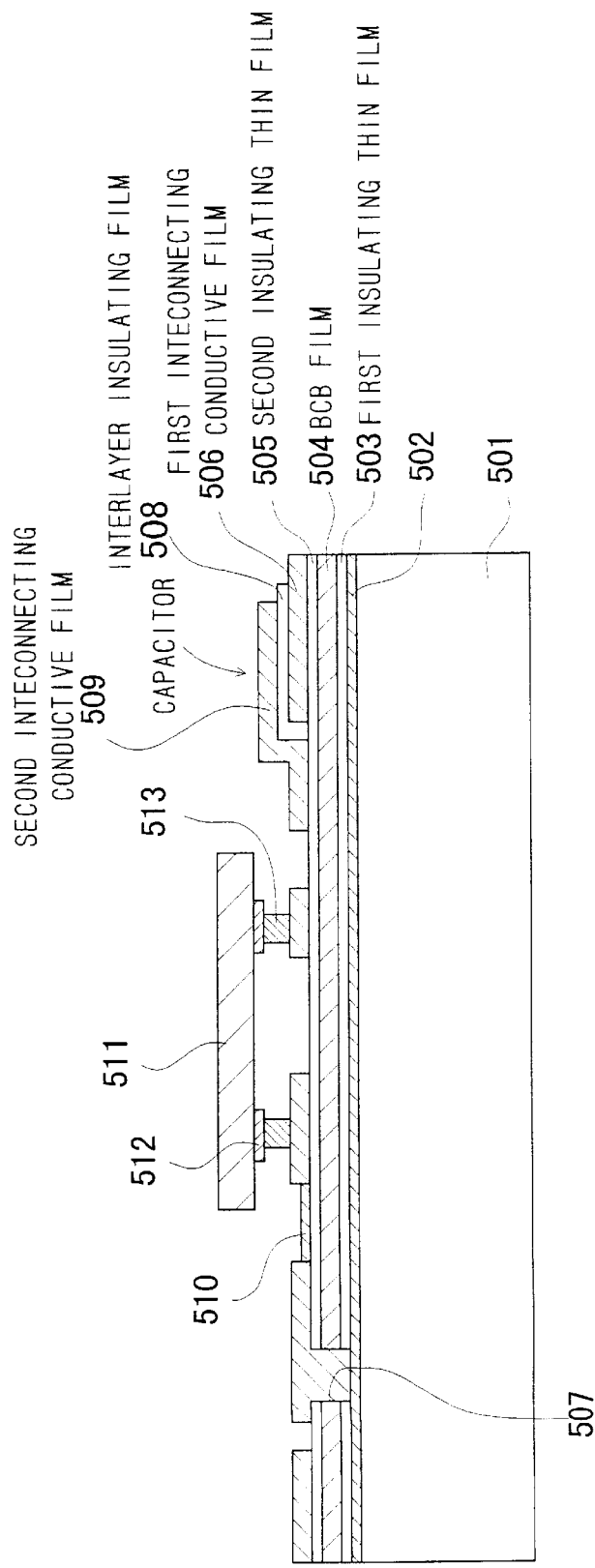
FIG. 24 is a cross-sectional view showing the structure of an MFIC according to a fourteenth embodiment.

In FIGS. 24 and 25 are shown: a substrate 501 composed of glass or Si; a ground conductive film 502 composed of a Ti/Au/Ti multilayer film formed on the substrate 501; a first insulating thin film composed of a silicon dioxide film formed on the ground conductive film 502; a BCB film 504 formed on the first insulating thin film 503; a second insulating thin film 505 composed of a silicon dioxide film formed on the BCB film 504; and a first interconnecting conductive film composed of Au and formed on the second insulating thin film 505. The first interconnecting conductive film 506 partially functions as a lower electrode of a capacitor. A contact hole 507 is for connecting the first interconnecting conductive film 506 to the ground conductive film 502. An interlayer insulating film 508 serves as a capacitive portion of the capacitor. A second interconnecting conductive film partially functions as an upper electrode of the capacitor. The ground conductive film 502, the first and second insulating thin films 503 and 505, the BCB film 504, and the interconnecting conductive film 506 or 509 constitute a microstrip line. A thin-film resistor 510 is formed on the second insulating thin film 505. A semiconductor chip 511 is formed with a transistor which is a hetero-junction field-effect transistor for radio frequencies having a cut-off frequency of 120 MHz for use with a quasi-millimeter wave and a millimeter wave. Signal interconnects 512 are provided on the semiconductor chip 511. Bumps 513 are used to connect the interconnecting conductive film 506 or 509 on the substrate 501 to the signal interconnects 512 on the semiconductor chip 511.

Below, a description will be given to the process of manufacturing an MFIC according to the present embodiment.

Figure 25A:
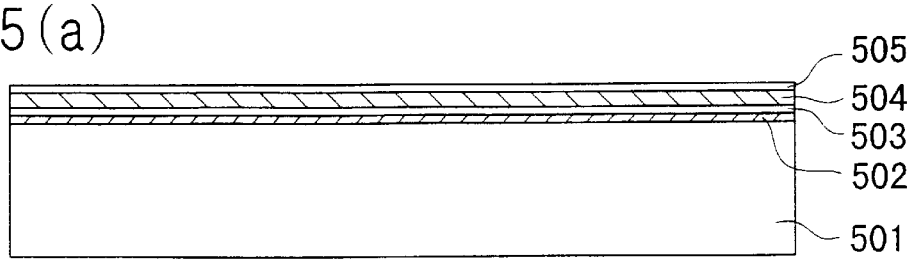
FIGS. 25(a) to 25(e) are cross-sectional views illustrating the process of manufacturing the MFIC according to the fourteenth embodiment.

First, as shown in FIG. 25(a), the Ti/Au/Ti multilayer film is formed as the ground conductive film 502 on the substrate 501 so that the individual layers have thicknesses of about 50 nm, 1000 nm, and 50 nm, respectively. On the ground conductive film 502, there is formed a silicon dioxide film having a thickness of 300 nm as the first insulating thin film 503. On the first insulating thin film 503, there are further formed the BCB film 504 having a thickness of about 26 $\mu$m and the second insulating thin film composed of a silicon nitride film having a thickness of about 300 nm.

Figure 25B:
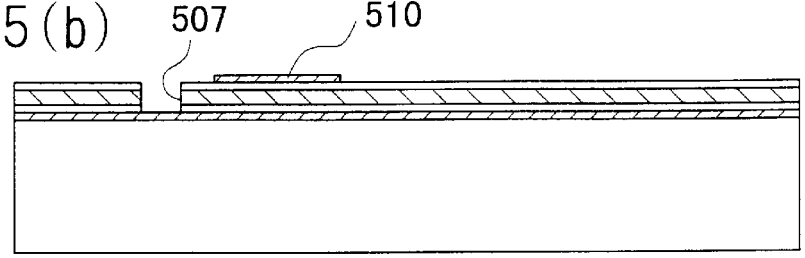

Next, as shown in FIG. 25(b), a thin-film resistor 510 composed of a NiCr thin film is formed on the second insulating thin film 505, followed by dry etching performed with respect to the second insulating thin film 505, the BCB film 504, and the first insulating thin film 503 by using a $CF_4/O_2$ mixture gas, thereby forming the contact hole 507 in a desired position.

Figure 25C:
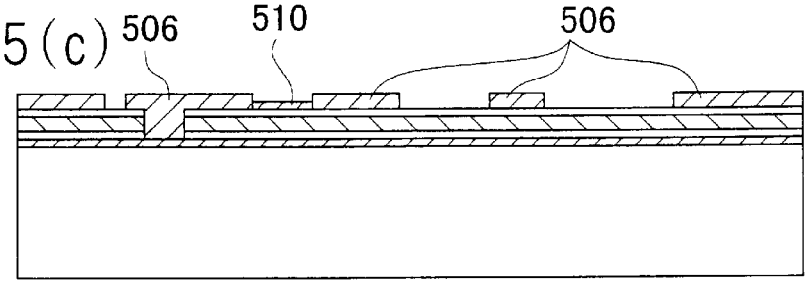

Then, as shown in FIG. 25(c), the first interconnecting conductive film 506 composed of a Ti/Au film having a desired pattern and a thickness of about 1 $\mu$m is formed in the contact hole 507 and on the second insulating thin film 505.

Figure 25D:
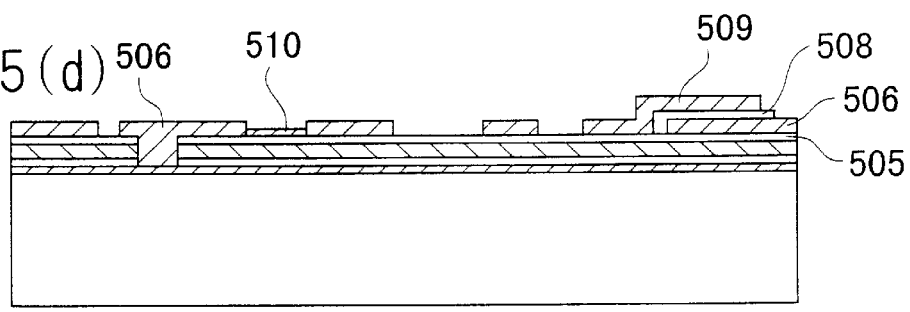

Subsequently, as shown in FIG. 25(d), a silicon nitride film having a desired pattern and a thickness of 200 nm is formed as the interlayer insulating film 508 for the MIM capacitor over the entire surface of the substrate. Thereafter, the second interconnecting conductive film 509 having a desired pattern is formed by Au plating. The second interconnecting conductive film 509 partially functions as an upper electrode of the MIM capacitor.

Figure 25E:
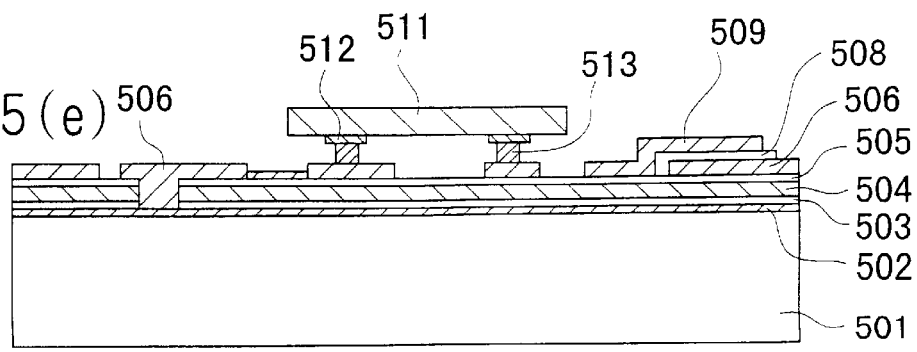

Next, as shown in FIG. 25(e), the bumps 513 each having a height of about 10 $\mu$m is formed on a desired portion of the first or second interconnecting conductive film 506 or 509. The bumps 513 are then connected to the signal interconnects 512 on the semiconductor chip 511, thereby completing the MFIC.

According to the present embodiment, the first insulating thin film 503 on the BCB film 504 serves to enhance the adhesion of the BCB film 504 to the ground conductive film 502, while the second insulating thin film 505 beneath the BCB film 504 serves to enhance the adhesion of the BCB film 504 to the first and second interconnecting conductive films 506 and 509. In addition, the second insulating thin film 505 on the BCB film 504 also functions as a protective film for preventing a heat generated from the NiCr thin film composing the thin-film resistor 510 from being transmitted to the BCB film 504. Since the heat generated from the thin-film resistor 510 is less likely to be transmitted to the BCB film 504, the BCB film 504 exhibits no cracking or thermal deformation resulting from a thermal shock, so that a highly reliable MFIC is implemented. Moreover, the second insulating thin film 505 also functions as a holder for the first or second interconnecting conductive film 506 or 509 in mounting the semiconductor chip 511 by flip-chip bonding. The arrangement prevents the bonding pressure from being transmitted to the inside of the BCB film 504 and absorbed therein so that a proper pressure is exerted on the bumps, resulting in satisfactory bonding.

(Fifteenth Embodiment)

Below, a fifteenth embodiment will be described. In the present embodiment, the description of the structure of a semiconductor device will be omitted and only the process of manufacturing the semiconductor device will be described with reference to FIGS. 26(a) to 26(e).

In FIGS. 26 are shown: a substrate 501 composed of glass or Si; a ground conductive film 502 composed of a Ti/Au/Ti multilayer film formed on the substrate 501; an insulating thin film 503 composed of a silicon dioxide film formed on the ground conductive film 502; a BCB film 504 formed on the insulating thin film 503; and an interconnecting conductive film 506 composed of Au and formed on the BCB film 504. A contact hole 507 is for connecting the first interconnecting conductive film 506 to the ground conductive film 502. A metal buried layer 520 is used to connect the interconnecting conductive film 506 to the ground conductive film 502. The ground conductive film 502, the insulating thin film 503, the BCB film 504, and the interconnecting conductive film 506 constitute a microstrip line. A semiconductor chip 511 is formed with a transistor which is a hetero-junction field-effect transistor for radio frequencies having a cut-off frequency of 120 MHz for use with a quasi-millimeter wave and a millimeter wave. Signal interconnects 512 are provided on the semiconductor chip 511. Bumps 513 are used to connect the interconnecting conductive film 506 on the substrate 501 to the signal interconnects 512 on the semiconductor chip 511.

Below, a description will be given to the process of manufacturing an MFIC according to the present embodiment.

Figure 26A:
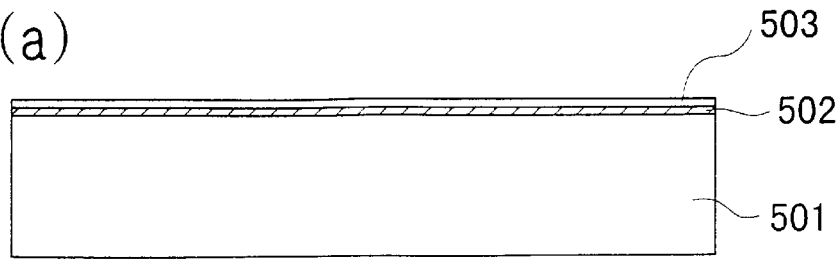
FIGS. 26(a) to 26(e) are cross-sectional views illustrating the process of manufacturing an MFIC according to a fifteenth embodiment.

First, as shown in FIG. 26(a), the Ti/Au/Ti multilayer film is formed as the ground conductive film 502 on the substrate 501 so that the individual layers have thicknesses of 50 nm, 1000 nm, and 50 nm, respectively. On the ground conductive film 502, there is formed a silicon dioxide film having a thickness of 300 nm as the insulating thin film 503.

Figure 26B:
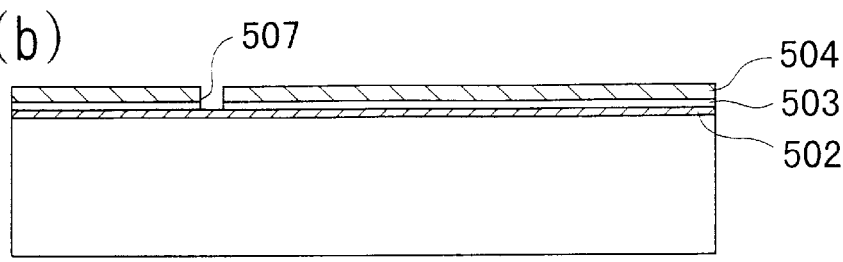

Next, as shown in FIG. 26(b), the BCB film 504 having a thickness of 20 $\mu$m is formed, followed by dry etching performed with respect to the insulating thin film 505, the BCB film 504, and the silicon dioxide film 503 by using a $CF_4/O_2$ mixture gas, thereby forming the contact hole 507 in a desired position.

Figure 26C:
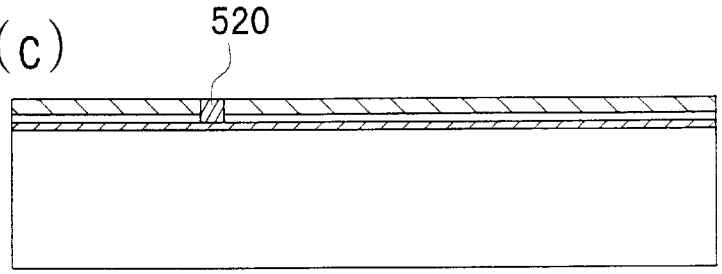

Next, as shown in FIG. 26(c), the metal buried layer 520 is formed in the contact hole 507 by selective plating using the ground conductive film 502 exposed in the contact hole 507 as a seed metal.

Figure 26D:
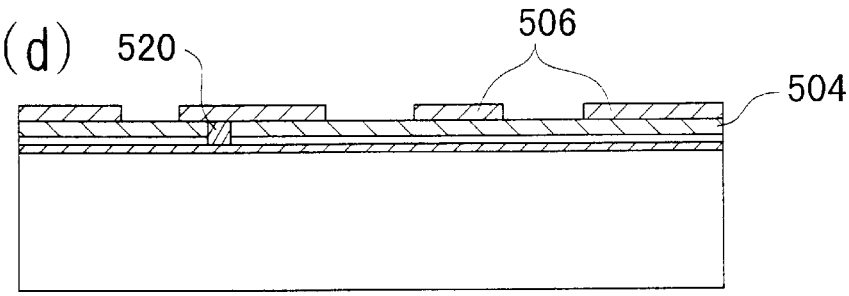

Then, as shown in FIG. 26(d), the interconnecting conductive film 506 having a desired pattern and a thickness of 1 $\mu$m is formed by Au plating over the metal buried layer 520 and the BCB film 504.

Figure 26E:
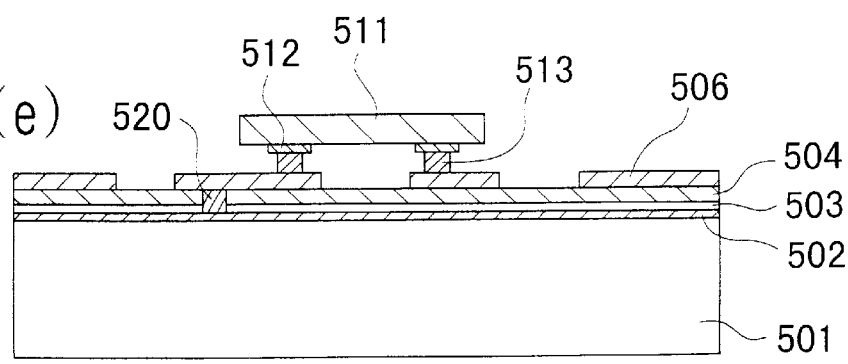

Subsequently, as shown in FIG. 26(e), the bumps 513 are formed by Au plating on desired portions of the interconnecting conductive films 506. Then, the signal interconnects 512 on the semiconductor chip 511 with the embedded transistor composed of a HEMT are connected to the top surface of the interconnecting conductive film 506 by flip-chip bonding, thereby completing the MFIC.

Since the present embodiment has used the insulating thin film 503 to enhance the adhesion of the thick BCB film 504, the following effects in addition to the same effects as achieved in the foregoing individual embodiments can be achieved.

With the addition of the step of filling the contact hole with a metal by selective plating, the following effect can be achieved: As higher integration is achieved and the pattern of transmission interconnects is increasingly miniaturized in a future MFIC using a BCB film for a dielectric film, a contact hole for grounding formed in the BCB film will be miniaturized accordingly and the aspect ratio of a contact hole will be considerably increased. With the contact hole having an increased aspect ratio, it becomes difficult to form an interconnecting conductive film with excellent coverage so that the step of filling the contact hole for grounding with metal by selective plating is newly introduced. The introduction allows the contact hole with a large aspect ratio, i.e., the small and deep contact hole to be filled with a buried metal layer, which remarkably facilitates the subsequent step of forming the interconnecting conductive films.

(Sixteenth Embodiment)

Below, a sixteenth embodiment will be described. The present embodiment relates to a structure in which an insulating thin film is provided under a bonding pad of an interconnecting conductive film.

Figure 27:
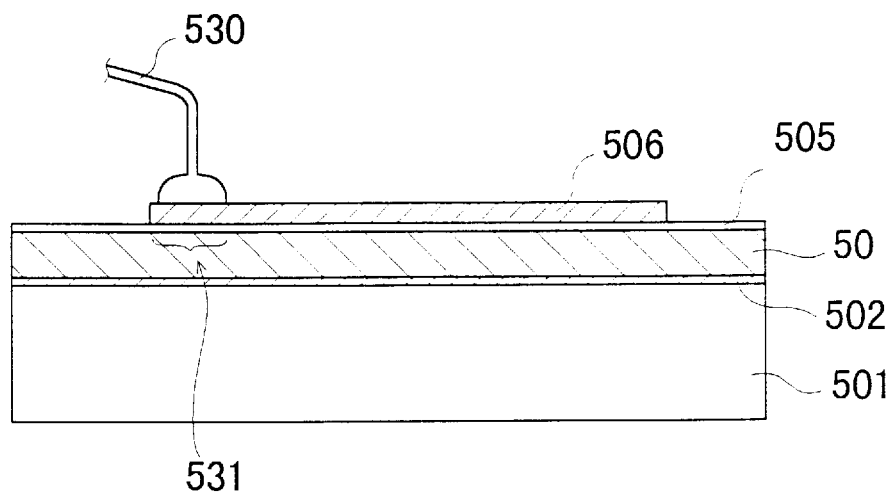
FIG. 27 is a cross-sectional view showing the structure of a wiring board in the vicinity of a pad portion in an MFIC according to a sixteenth embodiment.

In FIG. 27 are shown: a substrate 501 composed of glass or Si; a ground conductive film 502 composed of a Ti/Au/Ti multilayer film formed on the substrate 501; a BCB film 504 formed on the ground conductive film 502; an insulating thin film 505 formed on the BCB film 504; and an interconnecting conductive film 506 composed of Au and formed on the insulating thin film 505. An interconnect 530 is connected to a pad portion 531 of the interconnecting conductive film 506.

It is to be noted that a semiconductor chip with an embedded transistor such as a HEMT (not shown) is mounted on the substrate 501 in a region not included in the cross section shown in FIG. 27.

The present embodiment has provided the insulating thin film 505 at least under the pad portion 531 of the interconnecting conductive film 506 to which the interconnect 530 is connected in order to effectively prevent the interconnecting conductive film 506 from peeling off the BCB film 504 when the interconnect 530 is bonded to the microstrip line.

(Seventeenth Embodiment)

Figure 28:
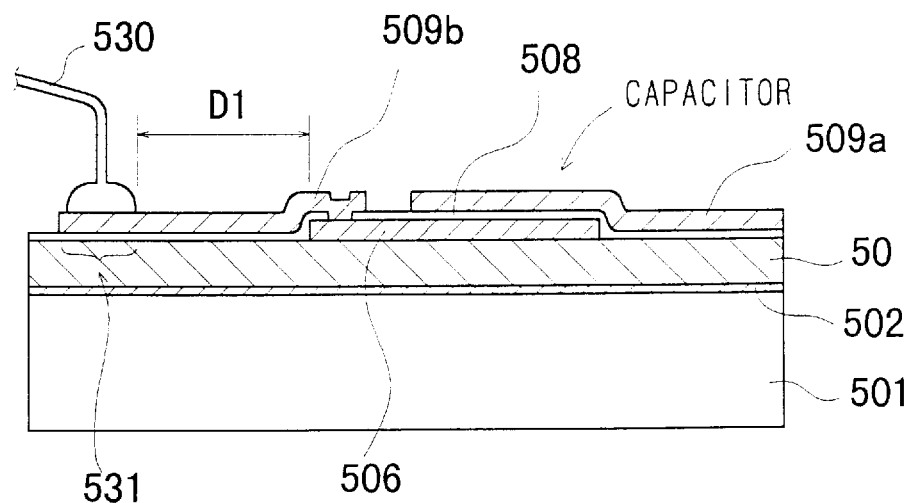
FIG. 28 is a cross-sectional view showing the structure of a wiring board in the vicinity of a pad portion in an MFIC according to a seventeenth embodiment.

Below, a seventeenth embodiment will be described. FIG. 28 is a cross-sectional view of a semiconductor device according to the present embodiment. However, a semiconductor chip is not shown in FIG. 28 since the structure shown in the drawing does not include a region on which the semiconductor chip is mounted.

In the drawing are shown: a substrate 501 composed of glass or Si; a ground conductive film 502 composed of a Ti/Au/Ti multilayer film formed on the substrate 501; a BCB film 504 formed on the ground conductive film 502; a first interconnecting conductive film 506 composed of Au and formed on the BCB film 504; an interlayer insulating film 508 composed of a silicon dioxide film, a silicon nitride film, or the like and serving as a capacitive portion of a capacitor; and a second interconnecting conductive film 509 composed of Au. The MIM capacitor comprises the first interconnecting conductive film 506 as a lower electrode thereof, the interlayer insulating film 508 as the capacitive portion thereof, and a portion 509a of the second interconnecting conductive film 509 as an upper electrode thereof. The interlayer insulating film 508 of the capacitor is formed over the entire surface of the BCB film 504 including the portion serving as the capacitive portion of the capacitor. The interlayer insulating film 508 enhances the adhesion of the BCB film 504 to the second interconnecting conductive film 509, similarly to each of the above embodiments. A portion 509b of the second interconnecting conductive film is connected to the first interconnecting conductive film 506 through an opening formed in a part of the interlayer insulating film 508. The part 509b of the second interconnecting conductive film is formed with a pad portion 531 to which a wire 530 is connected. In the second interconnecting conductive film 509, the pad portion 531 is provided at a distance D1 of 50 $\mu$m or more from the capacitor. In the region other than the capacitor, the ground conductive film 502, the BCB film 504, the interlayer insulating film 508, and the second interconnecting conductive film 509 constitute a microstrip line.

It is to be noted that the first interconnecting conductive film 506 with no underlying film serving as an insulating thin film, the BCB film 504, and the ground conductive film 502 constitute the microstrip line. In a region not included in the cross section shown in FIG. 28, a semiconductor chip with an embedded transistor such as a HEMT (not shown) is mounted on the substrate 501.

In forming an MIM capacitor on the substrate of the conventional MFIC, the interlayer insulating film serving as the capacitive portion of the capacitor is formed only between the upper and lower electrodes of the capacitor and the surrounding portion thereof. In the present embodiment, by contrast, the insulating film (interlayer insulating film 508) serving as the capacitive portion of the capacitor is formed over the entire surface of the BCB film 504 other than the capacitor so as to effectively prevent the interconnecting conductive film 509 from peeling off the BCB film in bonding the wire 530 by utilizing the insulating film needed by the capacitor, similarly to the insulating thin film 505 used in the above sixteenth embodiment. Hence, it is unnecessary to add an extra step of forming an insulating thin film for enhancing the adhesion of the interconnecting conductive film to the BCB film. As a result, the manufacturing cost can further be reduced than in the sixteenth embodiment.

(Eighteenth Embodiment)

Figure 29A:
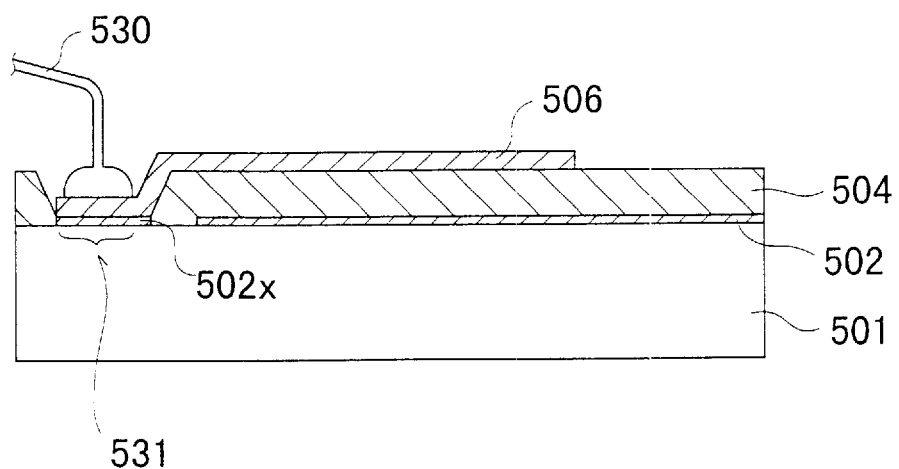
FIG. 29(a) is a cross-sectional view of a wiring board in the vicinity of a pad portion in an MFIC according to an eighteenth embodiment taken along the line II—II of FIG. 30.
Figure 30:
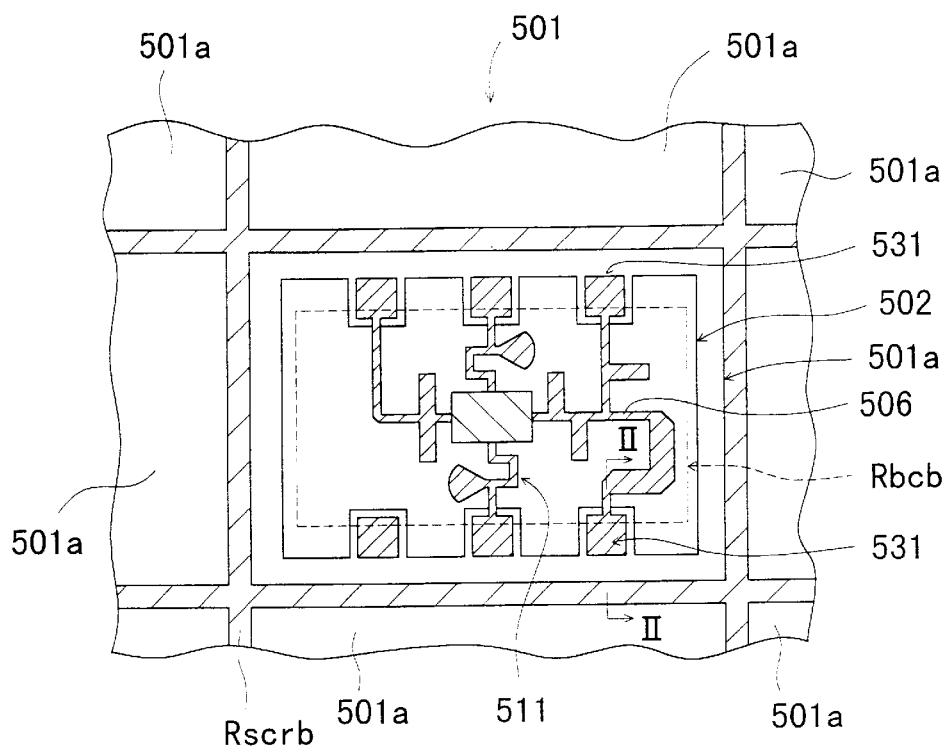
FIG. 30 is a plan view showing the structure of a substrate in the form of a wafer in the process of manufacturing the MFIC according to the eighteenth embodiment.

Below, an eighteenth embodiment will be described. FIGS. 29(a) and 30 are a cross-sectional view and a plan view of a semiconductor device according to the present embodiment. To be more specific, FIG. 29(a) is a cross-sectional view taken along the line II—II in a rectangular semiconductor chip 501a cut out from a substrate 501 in the form of a wafer shown in FIG. 30.

In FIG. 29(a) are shown: a substrate 501 made of glass; a ground conductive film 502 composed of a Ti/Au/Ti multilayer film formed on the substrate 501; a BCB film 504 formed on the ground conductive film 502; and an interconnecting conductive film 506 formed on the BCB film 504. In the present embodiment, a portion 502x of the ground conductive film 502 is separated from the other portion thereof and insulated from the ground. The portion 502x forms a pad portion 531. In the pad portion 531, the BCB film 504 is not present under the interconnecting conductive film 506 to which the wire 530 is connected.

On the other hand, a microstrip line and the like are formed on each of the rectangular substrate chips 501a cut out from the substrate 501 in the form of a wafer, as shown in FIG. 30. As can be seen from the drawing, the pad portion 531 is separated from the ground conductive film 502. On the substrate 501 are shown: a region Rbcb in which the BCB film 504 is to be formed; and a scribe line Rscrb. The BCB film 504 is not present in the scribe line Rscrb.

Although a semiconductor chip 511 has been mounted on each of the substrate chips 501a by flip-chip bonding before the substrate 501 in the form of a wafer is cut into the individual substrate chips 501a, it is also possible to mount the semiconductor chip 511 on the interconnecting conductive film 506 on each of the substrate chips 501a by flip-chip bonding after the substrate 501 in the form of a wafer has been cut into the individual substrate chips 501a.

The present embodiment can achieve the following effects.

First, since the interconnecting conductive film 506 is formed on the substrate 501 with intervention of not the BCB film 504 but the portion 502x of the ground conductive film 502, the interconnecting conductive film 506 exhibits enhanced adhesion to the underlie compared with the above individual embodiments, which more positively prevents the interconnecting conductive film 506 from peeling during wire bonding.

Second, the underlie of the interconnecting conductive film 506 in the pad portion 531 can easily be formed by patterning the ground conductive film 502.

Third, since the BCB film 504 is not present in the scribe line Rscrb, the BCB resin will not wind around the cutting blade when the substrate 501 in the form of a wafer is divided into the rectangular substrate chips 501a by dicing, resulting in a longer lifetime of the cutting blade and easier maintenance.

Fourth, since no stress is placed on the BCB film 504 during dicing, the interconnecting conductive film 506 on the BCB film 504 receives no damage.

Fifth, by dividing the BCB film 504 into smaller segments before cutting the substrate 501 in the form of a wafer, the stress placed on the BCB film is reduced so that cracking or the like is less likely to occur in the BCB film. In case cracking occurs in a portion of the BCB film, it is localized and will not expand to the other portion thereof, resulting in improved production yield.

Figure 29B:
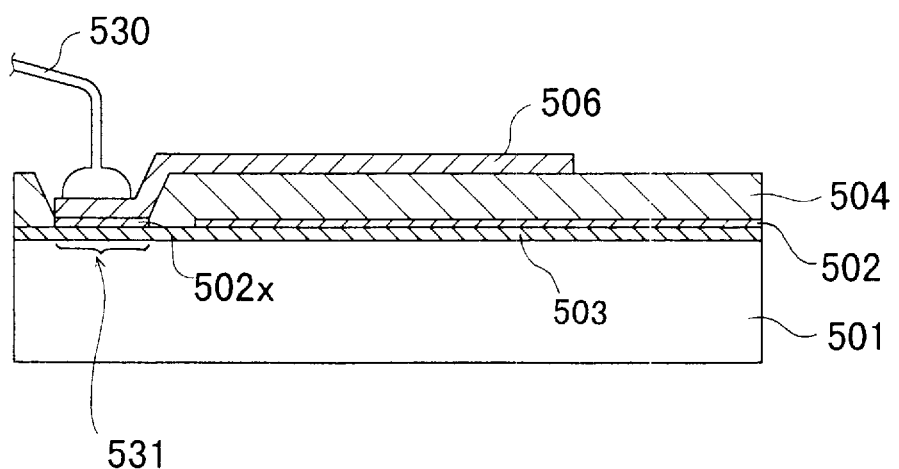
FIG. 29(b) is a cross-sectional view showing a variation of the eighteenth embodiment.

FIG. 29(b) is a cross-sectional view showing the structure of a variation of the present embodiment, in which the substrate 501 is composed of Si instead of glass. In this case, the insulating thin film 503 composed of a silicon dioxide film is formed on the substrate 501, followed by the formation of the ground conductive film 502, the BCB film 504, and the interconnecting conductive film 506 on the insulating thin film 503. The insulating thin film 503 thus provided surely prevents conduction between the ground conductive film 502 and the pad portion 531.

(Nineteenth Embodiment)

Below, a nineteenth embodiment will be described.

Figure 31:
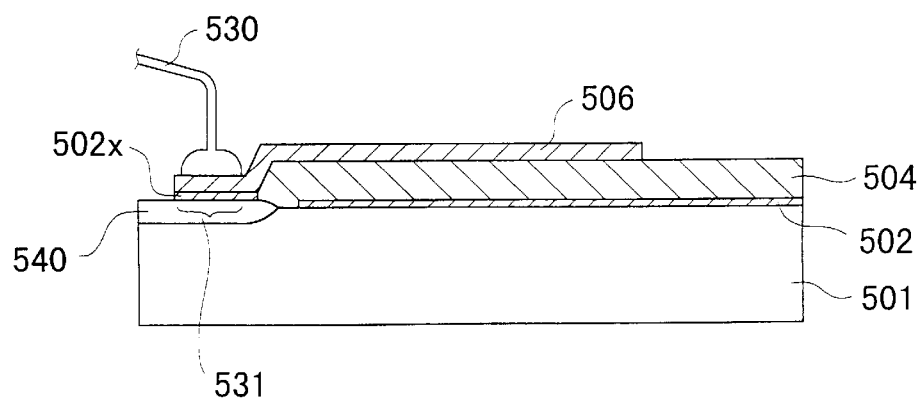
FIG. 31 is a cross-sectional view showing the structure of a wiring board in the vicinity of a pad portion in an MFIC according to a nineteenth embodiment.
Figure 32:
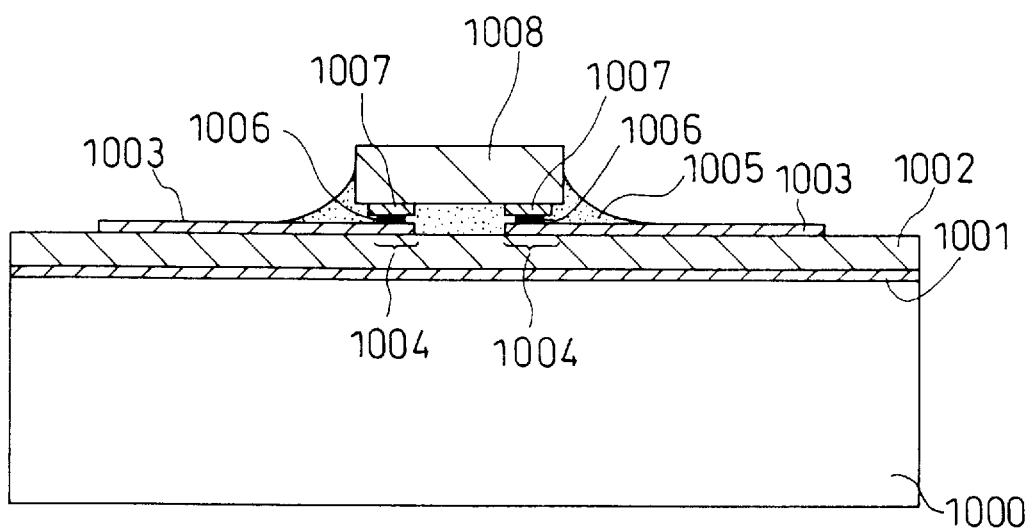
FIG. 32 is a cross-sectional view of a conventional MFIC.

As shown in FIG. 31, the structure of the present embodiment is basically the same as that of the above eighteenth embodiment. In the present embodiment, however, a substrate 501 is composed of single-crystal silicon and a pad portion 531 is disposed on a LOCOS film 540 composed of a silicon dioxide film formed on a portion of the substrate 501. In the case where the substrate is composed of a semiconductor such as silicon and a transistor is formed anywhere on the substrate 501, the LOCOS film 540 is formed to serve as an isolation. Hence, the pad portion 531 formed on the LOCOS film 540 has the advantage of being surely insulated from the ground without increasing the number of process steps.

Although the substrate 501 has been composed of glass or Si in the first to nineteenth embodiments, the substrate in accordance with the present embodiment is not limited thereto. A ceramic substrate or substrates of other materials may be used instead. Although the description has been given to the insulating thin film composed of a silicon dioxide film or a silicon nitride film, the insulating thin film in accordance with the present invention is not limited thereto but may be composed of an insulating film of different type.

Although the first and second insulating thin films described in the fourteenth embodiment are the silicon dioxide film and the silicon nitride film, respectively, the first insulating thin film may be a silicon nitride film and the second insulating thin film may be a silicon dioxide film. In each of the embodiments, a multilayer film consisting of a silicon dioxide film and a silicon nitride film or a silicon oxide/nitride film may also be used for any insulating thin film. Alteratively, an insulating film other than the silicon dioxide film and silicon nitride film, preferably, an inorganic insulating film may also be used. In the case of forming insulating thin films on and beneath the BCB film, the two insulating thin films may be of the same type.

The semiconductor chip described in each of the embodiments is not limited thereto but may be another device. Although each of the embodiments has described the interconnecting conductive films composed of single-layer interconnections, they may be composed of multi-layer interconnections depending on the layout of a pattern or the layout of passive elements. The materials of the interconnecting conductive films and ground conductive film are not limited to the ones shown in each of the above embodiments.

They may be selected arbitrarily from various conductive materials for use.

Although the ground conductive film is formed on the substrate in each of the above embodiments, the film is not necessarily grounded but the interconnecting conductive films may be grounded instead.

(Twentieth Embodiment)

A twentieth embodiment relates to a method of suppressing the deformation of a dielectric film by improving the structure of an electrode pad portion.

Figure 34A:
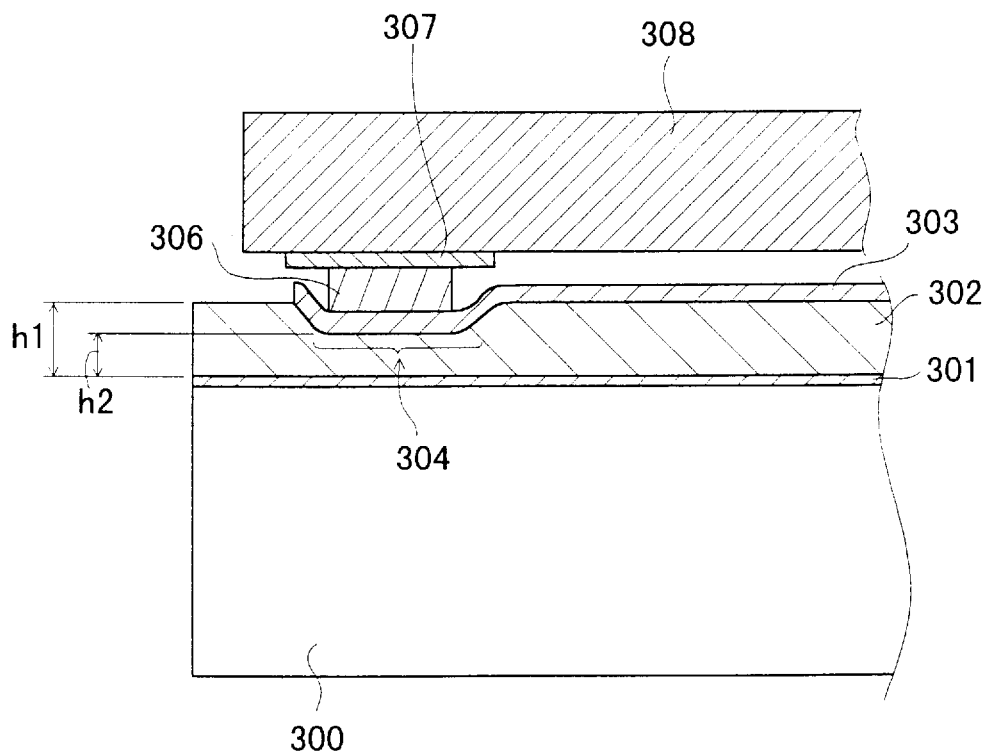
FIG. 34(a) is a cross-sectional view of a bump immediately after a pressure is applied thereto during the process of implementing an MFIC in a twentieth embodiment.
Figure 34B:
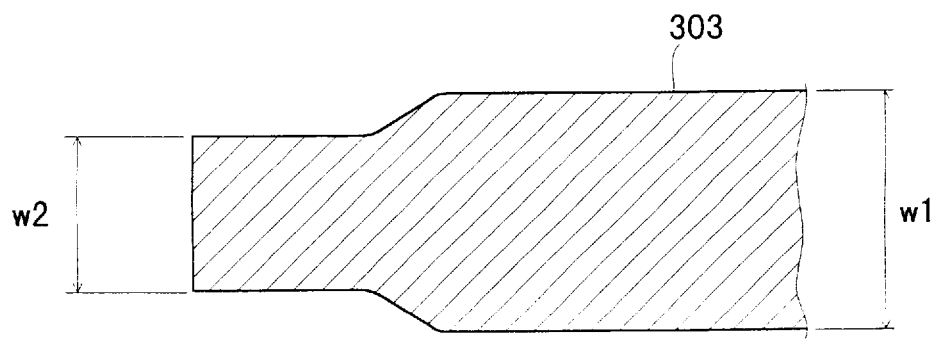
FIG. 34(b) is a plan view showing the configuration of an electrode pad of an interconnecting conductive film and its vicinity.

FIGS. 34(a) and 34(b) partially illustrate the process of implementing a semiconductor device according to the twentieth embodiment, of which FIG. 34(a) is an enlarged cross-sectional view of one connecting portion between a semiconductor chip 308 and a substrate 300 and its vicinity after pressing is conducted by the MBB method and FIG. 34(b) is a plan view showing the configuration of an interconnecting conductive film 303. In FIGS. 34(a) and 34(b), like reference numerals used in FIG. 12 showing the fifth embodiment designate like components so that the description thereof is omitted here.

The present embodiment is provided with no means for suppressing the deformation of the dielectric film 302. Instead, the interconnecting conductive film 303 is configured to have such a width W as to permit the characteristic impedance of the microstrip line to be held constant in consideration of a variation in the thickness h of the dielectric film 302. For example, when the dielectric film 302 composed of a BCB film has a thickness of about 20 $\mu$m and the microstrip line has a characteristic impedance of 50$\Omega$, the interconnecting conductive film 303 is so configured as to satisfy W=2.6 h. If it is assumed that the dielectric film 302 has an initial thickness h2 before the semiconductor chip 308 is mounted and has a thickness h2 at a connecting portion after the semiconductor chip 308 is mounted, the interconnecting conductive film 303 is so configured as to satisfy W1=2.6 h1 and W2=2.6 h2, which hold the characteristic impedance constant. In other words, the width W2 of the interconnecting conductive film 303 corresponding to the electrode pad portion 304 is adjusted to be smaller than the width W1 of the other major portion thereof by allowing for a reduction in the thickness of the dielectric film 302 after it has been deformed.

In the present embodiment, the characteristic impedance can be held constant by tolerating a change in dielectric constant resulting from the deformation of the dielectric film and determining the plan configuration of the interconnecting conductive film 303 depending on the change. It is to be noted that the conductor loss in the microstrip line is hardly affected by the reduced width of the interconnecting conductive film 303, which is limited to only a minor portion thereof.

It is also possible to configure the interconnecting conductive film in consideration of a variation in the thickness of the dielectric film in the structures according to the above third to tenth embodiment, similarly to the present embodiment. Since the thickness of the dielectric film may also change slightly in the foregoing embodiments, if the width of the interconnecting conductive film corresponding to the electrode pad portion is adjusted to be 5% smaller than the width of the other portion thereof in consideration of a thickness variation of 5%, the characteristic impedance can be adjusted more precisely, thereby providing excellent rf properties.

We claim:

1. A semiconductor device comprising:

a substrate having an underlying conductive film on at least one portion thereof;

a dielectric film composed of a benzocyclobutene (hereinafter referred to as BCB) film formed on said underlying conductive film;

an interconnecting conductive film formed on said dielectric film;

a semiconductor chip having an rf transistor and an electrode connected to said rf transistor, said semiconductor chip being mounted on said substrate by face-down bonding; and a bump interposed between said electrode and said interconnecting conductive film to provide connection therebetween, wherein said underlying conductive film, said dielectric film, and said interconnecting conductive film compose a microstrip line.

2. A semiconductor device according to claim 1, wherein the rf transistor embedded in said semiconductor chip has an operating frequency of 10 GHz or more.

3. A semiconductor device comprising:

a substrate having an underlying conductive film on at least one portion thereof;

a first dielectric film composed of a BCB film formed on said underlying conductive film;

a first interconnecting conductive film formed on said first dielectric film;

a second dielectric film composed of an insulating film formed on said first interconnecting conductive film;

a second interconnecting conductive film formed on said second dielectric film;

a semiconductor chip having an rf transistor and an electrode connected to said rf transistor, said semiconductor chip being mounted on said substrate by face-down bonding; and a bump interposed between said electrode and said second interconnecting conductive film to provide connection therebetween, wherein said underlying conductive film, said first dielectric film, and said first interconnecting conductive film compose a microstrip line and said first interconnecting conductive film, said second dielectric film, and said second interconnecting conductive film compose a MIM capacitor.

4. A semiconductor device according to claim 3, wherein the rf transistor embedded in said semiconductor chip has an operating frequency of 10 GHz or more.

5. A semiconductor device comprising:

a substrate having an underlying conductive film on at least one portion thereof;

a dielectric film formed on said underlying conductive film;

an interconnecting conductive film formed on said dielectric film, said interconnecting conductive film in conjunction with said underlying conductive film and said dielectric film composing a microstrip line;

a semiconductor chip having an rf transistor and an electrode connected to said rf transistor, said semiconductor chip being mounted on said substrate by face-down bonding such that said electrode is connected to a portion of said interconnecting conductive film on said substrate; and a bump provided in a connecting portion between said electrode and said interconnecting conductive film to provide connection therebetween, wherein after said semiconductor chip is mounted on said substrate, a variation caused by the mounting of said semiconductor chip in the distance between the bottom surface of said semiconductor chip and the top surface of said dielectric film in said connecting portion is larger than a variation caused by the mounting of said semiconductor chip in the thickness of said dielectric film under said connecting portion.

6. A semiconductor device according to claim 5, wherein said dielectric film is composed an organic material containing at least any of BCB, polyimide, and acrylic.

7. A semiconductor device according to claim 5, wherein each of said bump and said electrode contains Au.

8. A semiconductor device according to claim 5, wherein the variation in thickness of said dielectric film when at least one of said bump and said electrode is deformed by compression till the amount of deformation thereof is saturated is 10% or less.

9. A semiconductor device according to claim 5, wherein at least one of said electrode and said interconnecting conductive film is provided with a dummy pad for reducing an impact load which does not contribute to signal transmission or power supply.

10. A semiconductor device according to claim 9, wherein said dummy pads for reducing impact load are disposed on the periphery of said semiconductor chip.

11. A semiconductor device according to claim 5, further comprising
a dummy bump interposed between said semiconductor chip and said interconnecting conductive film, said dummy bump not contributing to signal transmission or power supply.

12. A semiconductor device according to claim 5, wherein said bump has a thickness of 5 $\mu$m or less after said semiconductor chip is mounted.

13. A semiconductor device according to claim 5, wherein said rf transistor chip has an operating frequency of 10 GHz or more.

14. A semiconductor device according to claim 5, wherein said semiconductor chip is adhered to said substrate by means of a light setting contractive insulation resin provided in a region including the connecting portion between said electrode and said interconnecting conductive film.

15. A semiconductor device according to claim 5, wherein in the connecting portion between said electrode and said interconnecting conductive film, a buffer layer composed of a material having a Young's modulus smaller than that of said dielectric film is provided under at least one of said electrode and said interconnecting conductive film.

16. A semiconductor device according to claim 5, wherein in the connecting portion between said electrode and said interconnecting conductive film, a hollow portion is provided under at least one of said electrode and said interconnecting conductive film.

17. A semiconductor device according to claim 5, wherein said bump has at least one void in the inside thereof.

18. A semiconductor device according to claim 5, further comprising:
supports disposed on at least two separate portions of said semiconductor chip in the vicinity of said connecting portion in such a manner as to sandwich said connecting portion therebetween, said supports being composed of a material having a Young's modulus larger than that of the material composing said dielectric film and having a height larger than the total thickness of said electrode, said bump, and said interconnecting conductive film.

19. A semiconductor device, comprising:
a substrate in the form of a wafer;
an underlying conductive film formed on said substrate;
a BCB film formed on at least one portion of said underlying conductive film; and
an interconnecting conductive film formed on said BCB film, said interconnecting conductive film in conjunction with said underlying conductive film and said BCB film composing a microstrip line, wherein
said BCB film is not present on a region of said substrate to be scribed for dividing said substrate into a plurality of substrate chips, said BCB film being divided into segments corresponding to said individual substrate chips.

20. A semiconductor device comprising
a wiring board having a substrate and a dielectric film formed on said substrate, wherein
said dielectric film comprises:
a benzocyclobutene film (hereinafter referred to as a BCB film) formed on at least one portion of said substrate; and
an insulating thin film formed at least on or beneath said BCB film.

21. A semiconductor device according to claim 20, wherein
said insulating film is composed of at least one of silicon nitride, silicon dioxide, and silicon oxide/nitride.

22. A semiconductor device according to claim 20, wherein
said BCB film has a thickness larger than 10 $\mu$m.

23. A semiconductor device according to claim 20, further comprising
a conductive film formed on the side of said insulating thin film opposite to said BCB film.

24. A semiconductor device according to claim 23, wherein
said conductive film is an underlying conductive film formed on or beneath said substrate and
said BCB film is formed on said underlying conductive film,
said semiconductor device further comprising
an interconnecting conductive film formed on the side of said BCB film and said insulating thin film opposite to said underlying conductive film,
said underlying conductive film, said BCB film, said insulating thin film, and said interconnecting conductive film composing a microstrip line.

25. A semiconductor device according to claim 24, further comprising:
a semiconductor chip having a transistor;
a signal interconnect formed on a surface of said semiconductor chip and connected to said transistor; and
a bump formed on at least one of said signal interconnect and said interconnecting conductive film, wherein
said signal interconnect on said semiconductor chip is connected to said interconnecting conductive film via said bump.

26. A semiconductor device according to claim 25, wherein
said insulating thin film is formed at least between said BCB film and said interconnecting conductive film, said semiconductor device further comprising
a thin-film resistor formed on said insulating thin film.

27. A semiconductor device according to claim 25, wherein
said insulating thin film is formed at least between said BCB film and said interconnecting conductive film and
a pad region connected to an external member via a wire is formed in a portion of said interconnecting conductive film.

28. A semiconductor device according to claim 25, further comprising a capacitor, wherein
said insulating thin film is formed at least between said BCB film and said interconnecting conductive film,
said semiconductor device further comprising
a lower electrode film of said capacitor provided in a part of the space between said insulating thin film and said BCB film, wherein
said interconnecting conductive film functions as an upper electrode of said capacitor over said lower electrode film and
said insulating thin film functions as a capacitive portion of said capacitor between said lower electrode film and said interconnecting conductive film and extends to a region not overlying said lower electrode film to be interposed between said interconnecting conductive film and said BCB film.

29. A semiconductor device according to claim 28, further comprising
a pad region formed in a portion of said interconnecting conductive film and connected to an external member via a wire, wherein
said pad region is at a distance of 50 μm or more from the portion functioning as the upper electrode of said capacitor.

30. A semiconductor device according to claim 28, wherein
the region of said interconnecting conductive film other than the portion functioning as the upper electrode of said capacitor is provided with a withdrawn portion connected to said lower electrode film through a contact hole formed in said insulating thin film and
a part of said withdrawn portion of said interconnecting conductive film is formed with a pad region connected to an external member via a wire.

31. A semiconductor device according to claim 20, wherein
said substrate is composed of Si or glass.

32. A semiconductor device according to claim 20, wherein
said semiconductor chip is composed of a compound semiconductor containing GaAs.

33. A semiconductor device according to claim 20, wherein
said semiconductor chip is composed of a semiconductor having a hetero junction.

34. A semiconductor device according to claim 20, wherein
said transistor is a transistor for radio frequencies ranging from the K-band to the millimeter-wave band.

35. A semiconductor device comprising:
a substrate;
an underlying conductive film formed on said substrate;
a BCB film formed on at least a portion of said underlying conductive film; and
an interconnecting conductive film formed on said BCB film, said interconnecting conductive film in conjunction with said underlying conductive film and said BCB film composing a microstrip line, wherein
said interconnecting conductive film extends to a region over said substrate and uncovered with said BCB film, said region being formed with a pad region connected to an external member via a wire.

36. A semiconductor device according to claim 35, wherein
a major part of said underlying conductive film functions as a ground conductive film and
a portion of said underlying conductive film is separated from said major part and a pad region of said interconnecting conductive film is formed on the portion of said underlying conductive film.

37. A semiconductor device comprising:
a substrate composed of a semiconductor;
an isolation composed of an insulating material and formed on said substrate;
an underlying conductive film formed on said substrate;
a BCB film formed on a region overlying at least a part of said underlying conductive film and not including said isolation; and
an interconnecting conductive film formed on said BCB film, said interconnecting conductive film in conjunction with said underlying conductive film and said BCB film composing a microstrip line, wherein
said interconnecting conductive film extends to a region over said isolation, said region being formed with a pad region connected to an external member via a wire.

38. A semiconductor device according to claim 37, wherein
said substrate is composed of Si or glass.

39. A semiconductor device according to claim 37, wherein
said semiconductor chip is composed of a compound semiconductor containing GaAs.

40. A semiconductor device according to claim 37, wherein
said semiconductor chip is composed of a semiconductor having a hetero junction.

41. A semiconductor device according to claim 37, wherein
said transistor is a transistor for radio frequencies ranging from the K-band to the millimeter-wave band.

* * * * *